United States Patent
Kroehnert et al.

(10) Patent No.: US 8,410,595 B2
(45) Date of Patent: Apr. 2, 2013

(54) SEMICONDUCTOR DEVICE WITH CHIP MOUNTED ON A SUBSTRATE

(75) Inventors: Steffen Kroehnert, Dresden (DE); Kerstin Nocke, Dresden (DE); Juergen Grafe, Dresden (DE); Kashi Vishwanath Machani, Dresden (DE)

(73) Assignee: Qimonda AG, Munich (DE)

( * ) Notice: Subject to any disclaimer, the term of this patent is extended or adjusted under 35 U.S.C. 154(b) by 1104 days.

(21) Appl. No.: 11/966,960

(22) Filed: Dec. 28, 2007

(65) Prior Publication Data

US 2008/0157330 A1 Jul. 3, 2008

(30) Foreign Application Priority Data

Dec. 28, 2006 (DE) .................. 10 2006 062 473

(51) Int. Cl.
*H01L 23/055* (2006.01)
(52) U.S. Cl. ............ 257/686; 257/698; 257/E2319
(58) Field of Classification Search ........... 257/686; *H01L 23/04*
See application file for complete search history.

(56) References Cited

U.S. PATENT DOCUMENTS

| 5,401,688 A | 3/1995 | Yamaji et al. | |
|---|---|---|---|
| 5,866,943 A * | 2/1999 | Mertol | 257/712 |
| 6,380,616 B1 * | 4/2002 | Tutsch et al. | 257/686 |
| 6,724,076 B1 | 4/2004 | Kahlisch et al. | |
| 7,256,070 B2 | 8/2007 | Reiss et al. | |
| 7,274,110 B2 | 9/2007 | Meyer et al. | |
| 2003/0205797 A1 * | 11/2003 | Takahashi et al. | 257/678 |
| 2004/0058477 A1 * | 3/2004 | Li et al. | 438/119 |
| 2004/0061207 A1 * | 4/2004 | Ding | 257/678 |
| 2004/0104470 A1 * | 6/2004 | Bang et al. | 257/724 |
| 2005/0104209 A1 * | 5/2005 | Kang | 257/737 |
| 2006/0186538 A1 * | 8/2006 | Suzuka | 257/737 |

FOREIGN PATENT DOCUMENTS

| DE | 195 42 883 A1 | 8/1996 |
|---|---|---|
| DE | 198 01 312 A1 | 7/1999 |
| DE | 199 54 888 A1 | 5/2001 |
| DE | 102 38 581 A1 | 3/2004 |
| DE | 10 2004 029 586 A1 | 1/2006 |

* cited by examiner

*Primary Examiner* — Jarrett J Stark
*Assistant Examiner* — Lawrence Tynes, Jr.
(74) *Attorney, Agent, or Firm* — John S. Economou

(57) ABSTRACT

A semiconductor device is disclosed. At least one semiconductor chip is mounted on a substrate and is contacted to contact elements of the substrate. The encapsulation of the semiconductor chip includes the substrate, a cover and a pocket within the connected substrate and cover. The pocket is able to fix the chip in its position, and the cover is composed of the same material as the substrate.

42 Claims, 18 Drawing Sheets

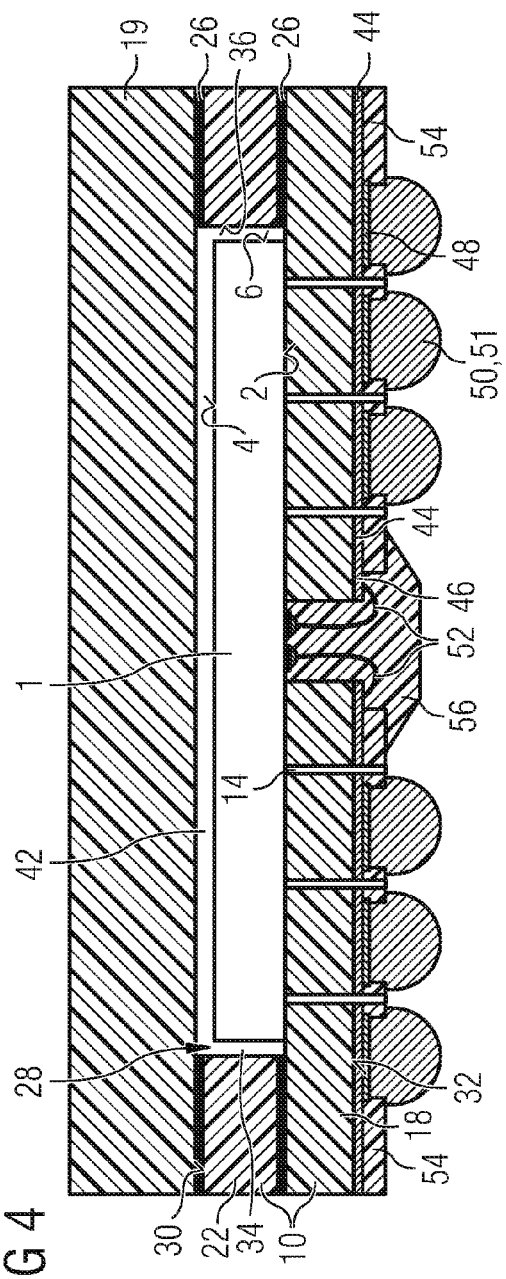
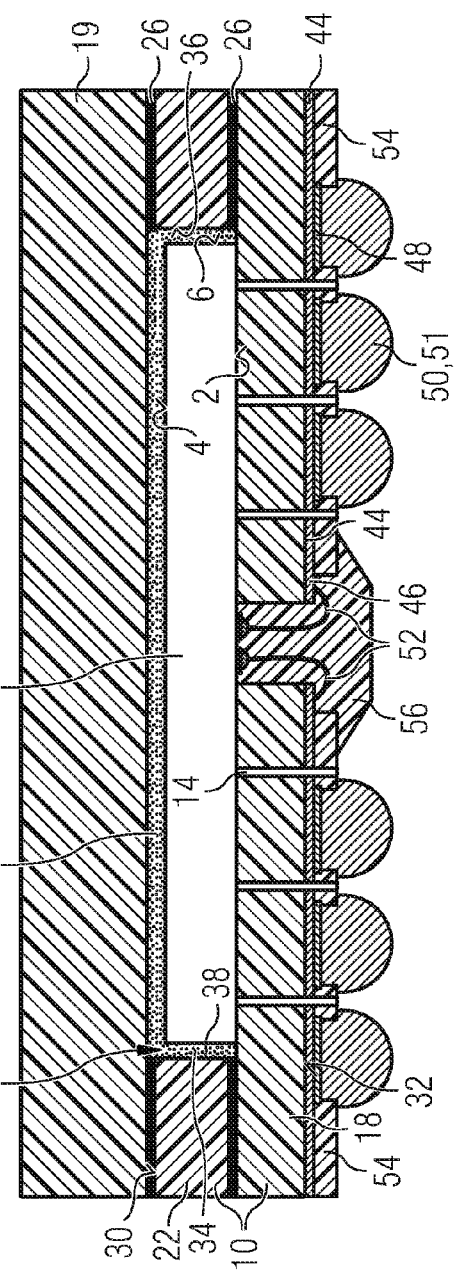
FIG 4
FIG 4A

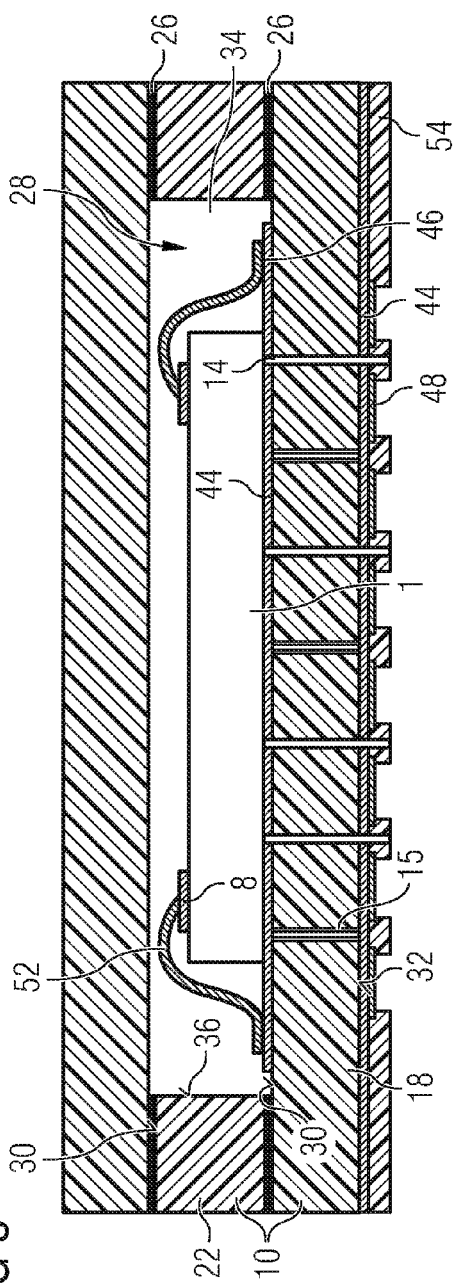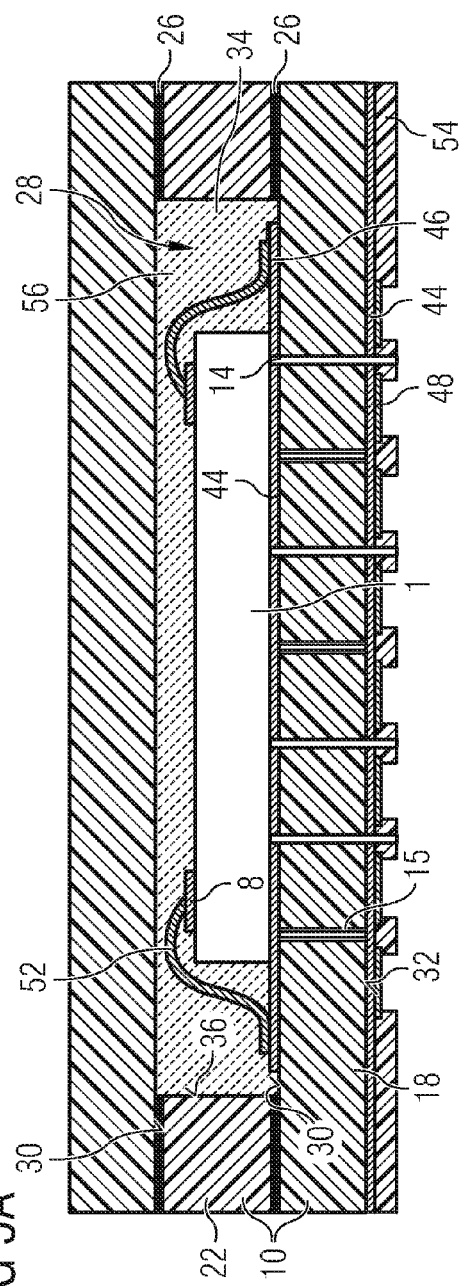

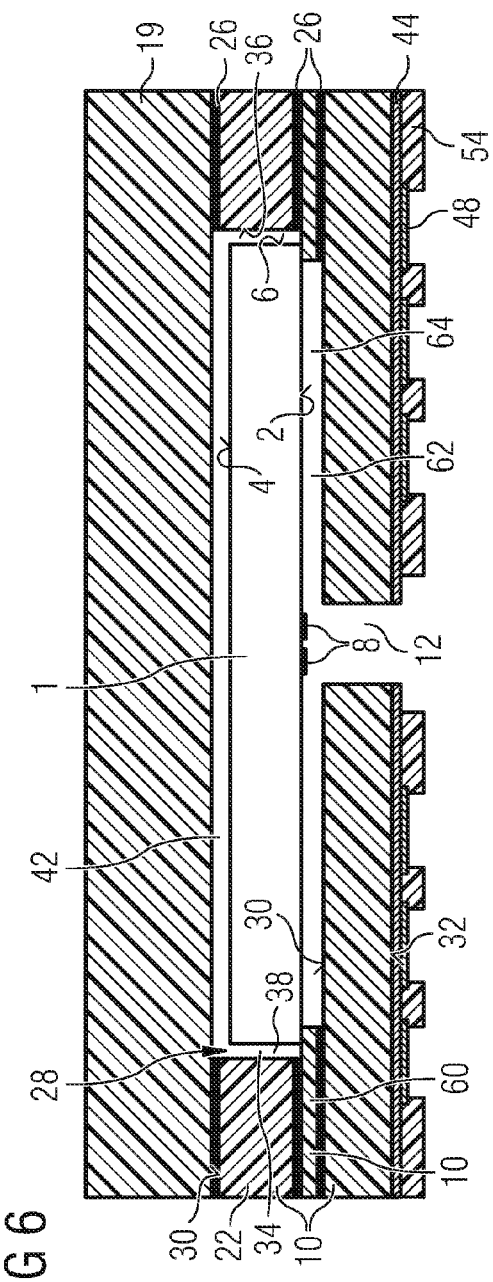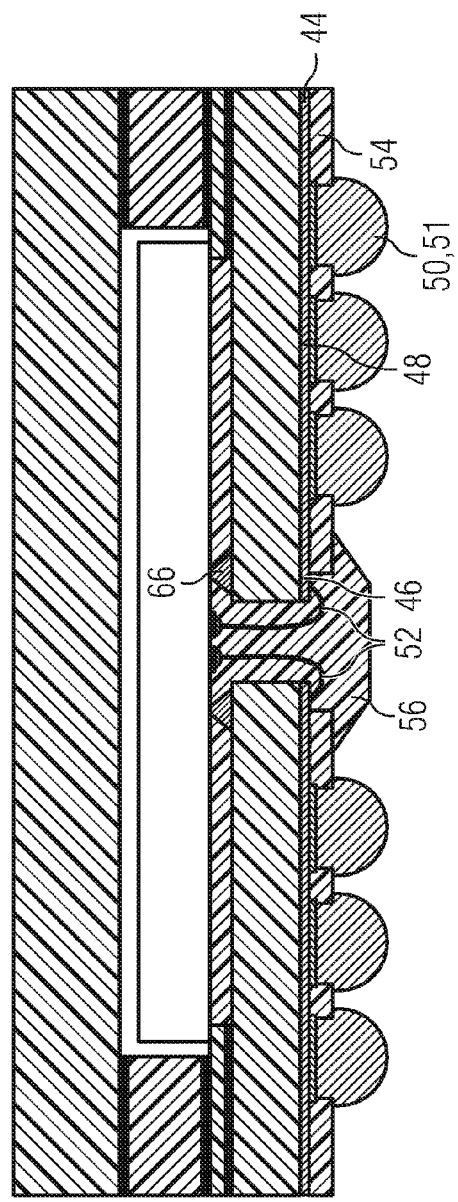

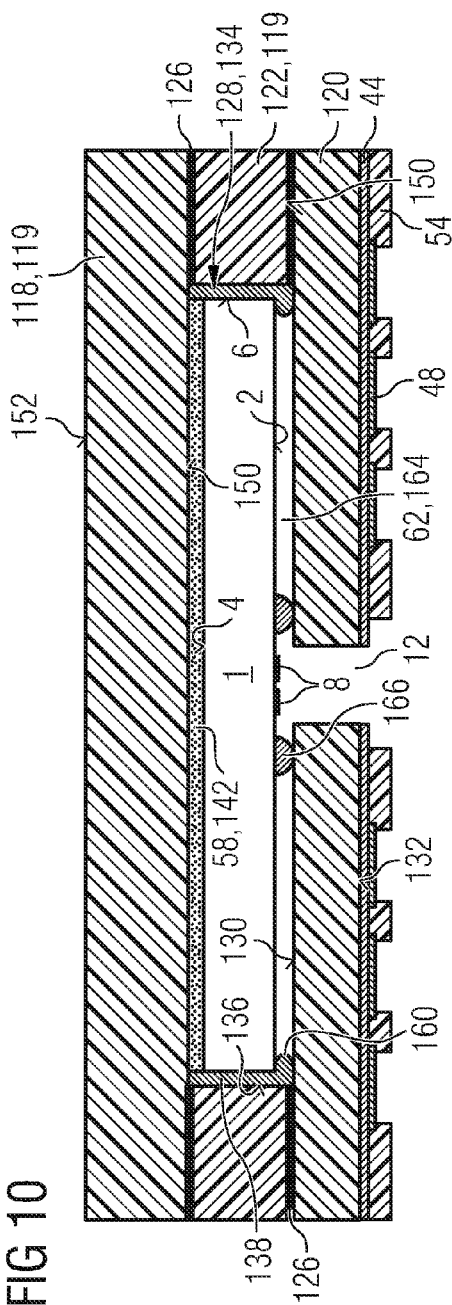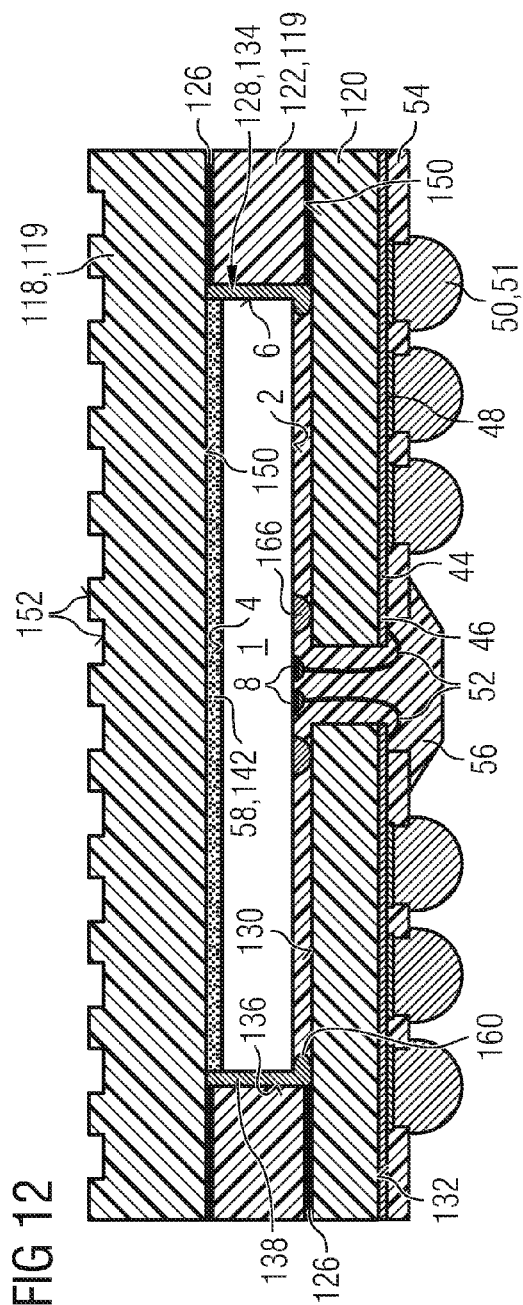

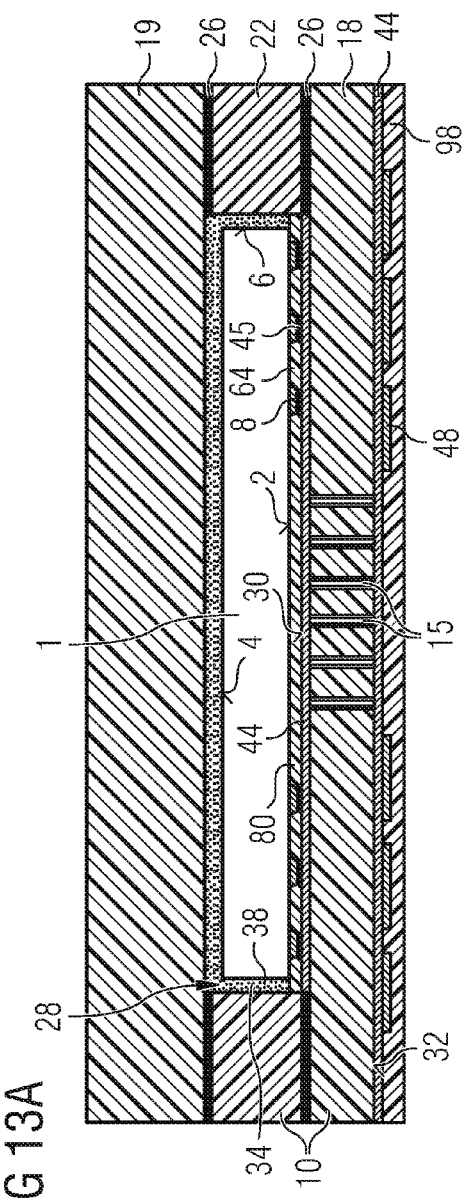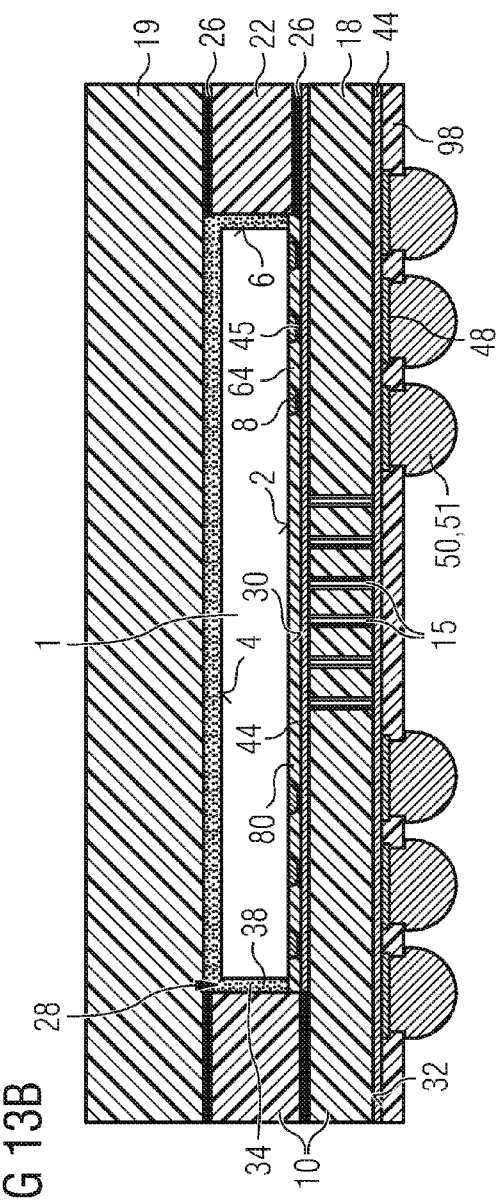

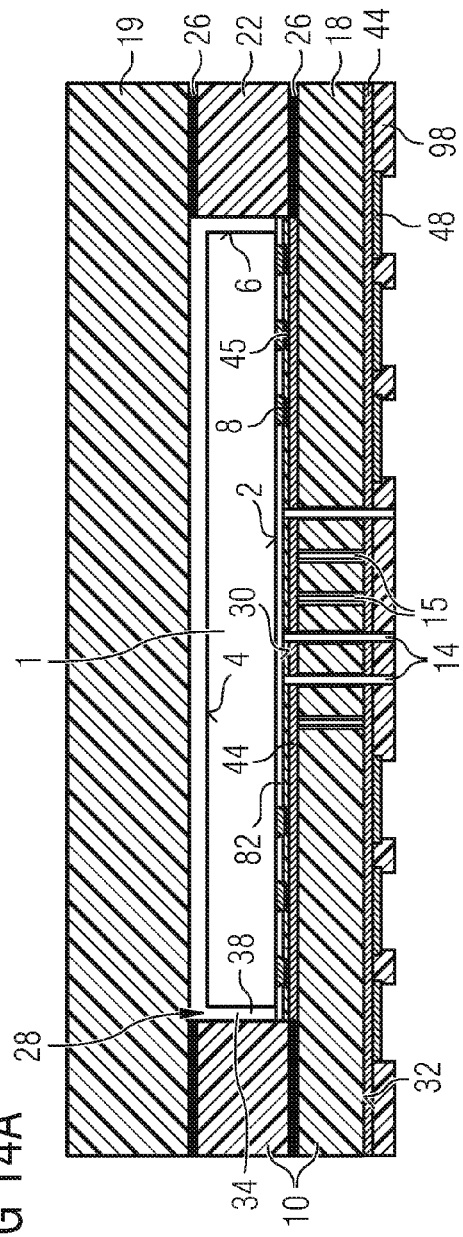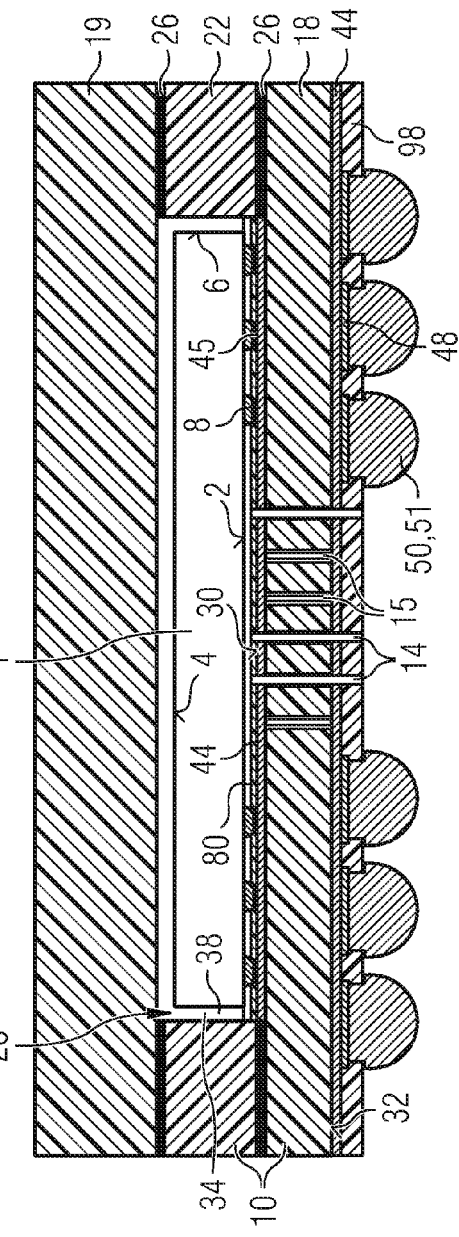

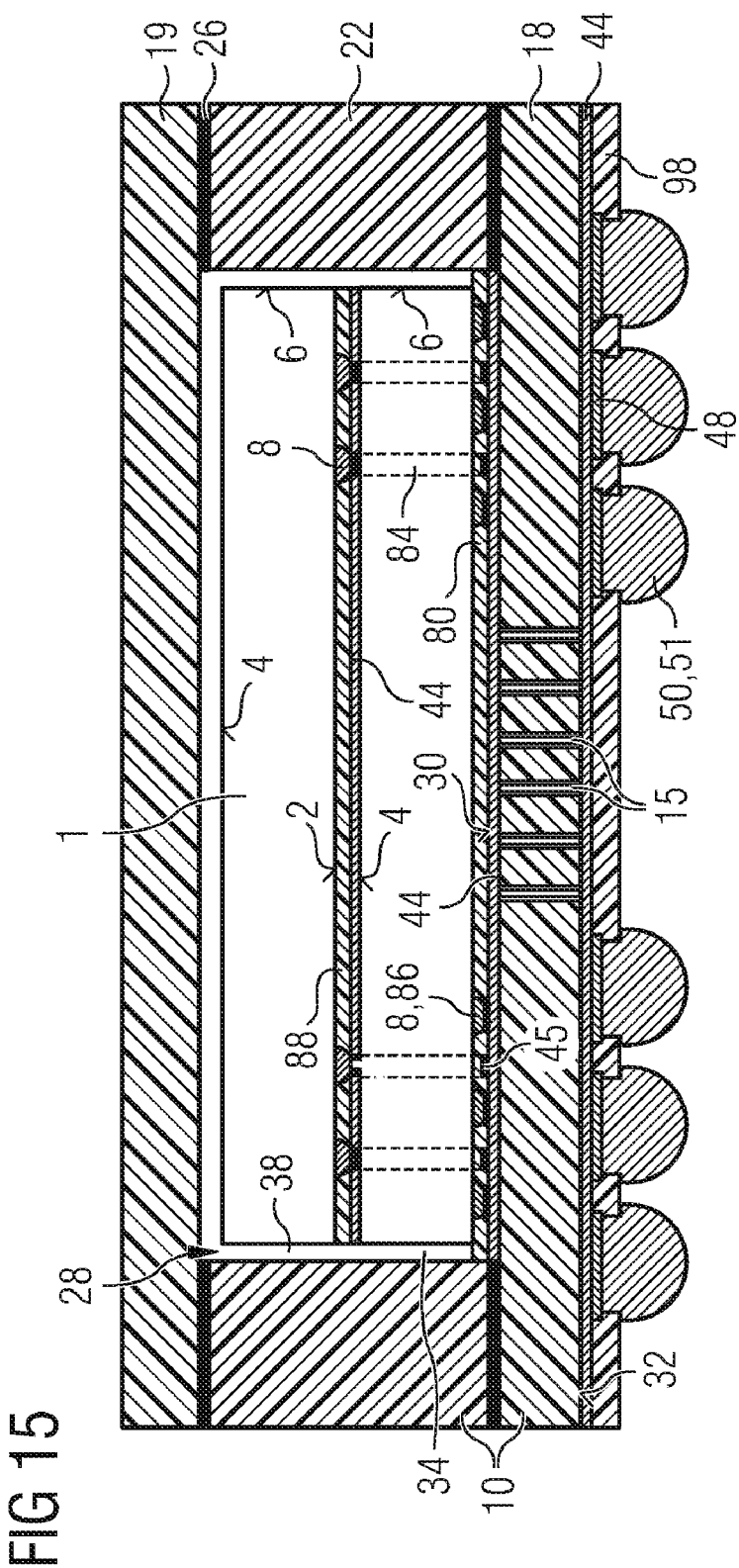

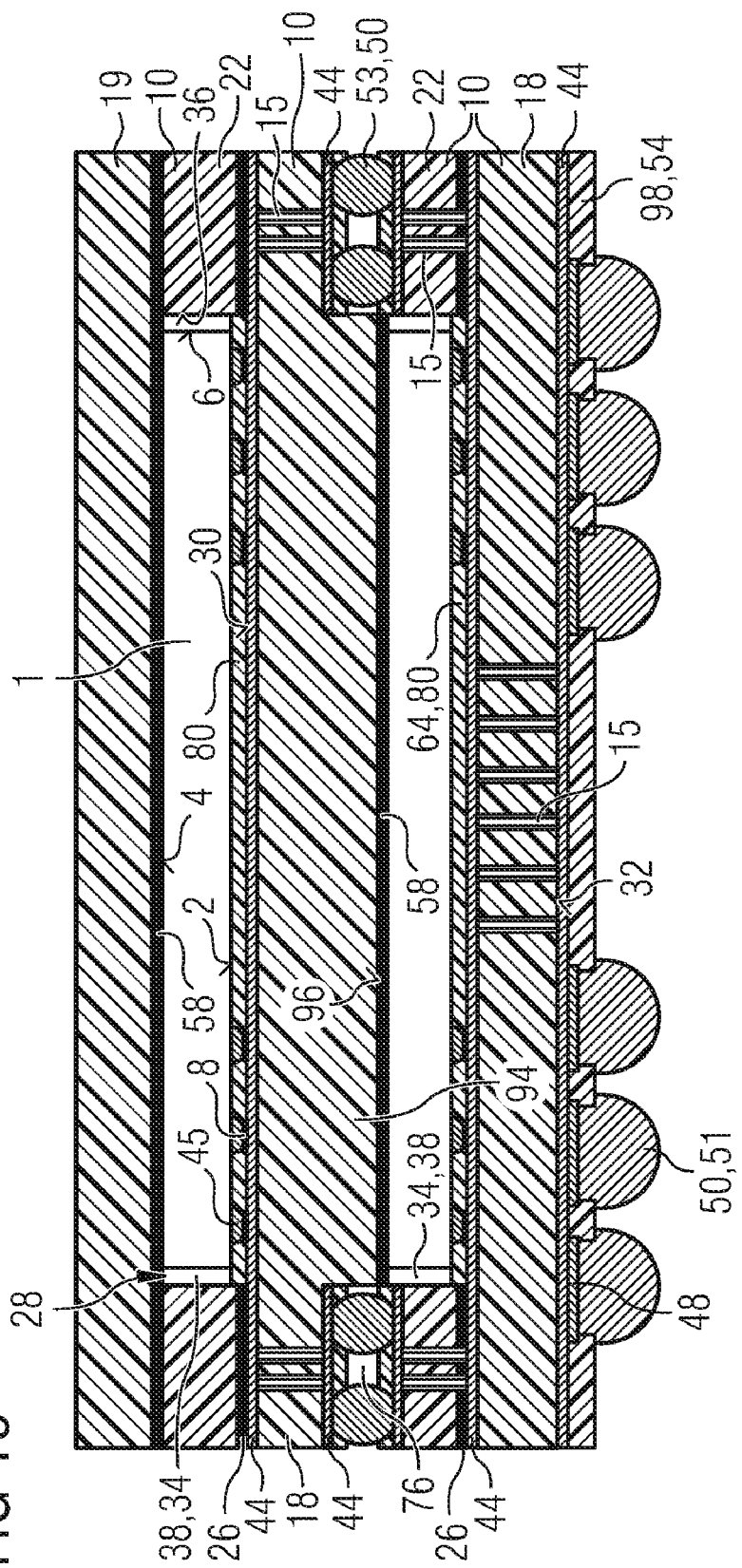

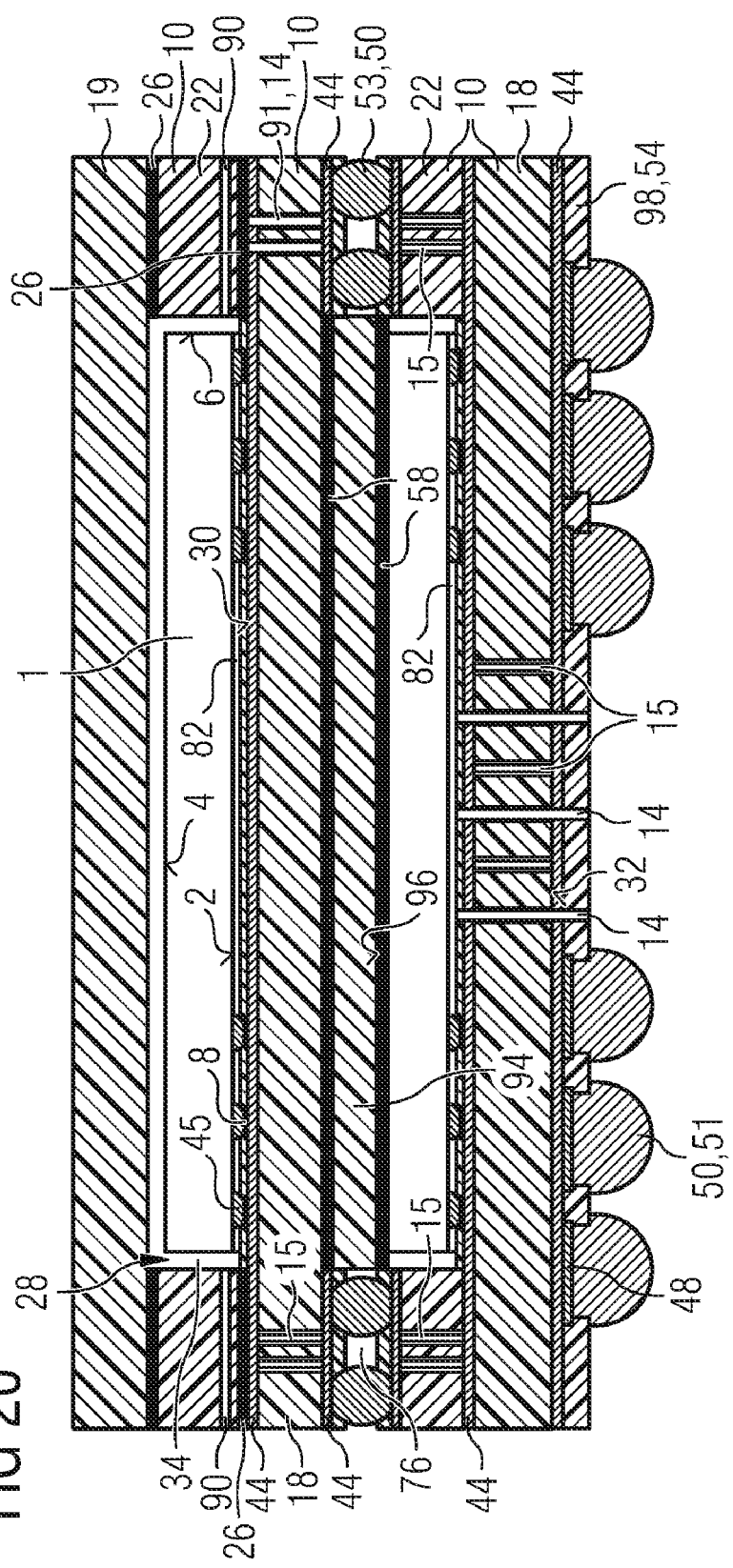

SEMICONDUCTOR DEVICE WITH CHIP MOUNTED ON A SUBSTRATE

This application claims priority to German Patent Application 10 2006 062 473.4, which was filed Dec. 28, 2006 and is incorporated herein by reference.

BACKGROUND

Conventional semiconductor devices comprise one or more semiconductor chips and, if appropriate, further circuit elements which are mounted and electrically contacted to contact elements of a substrate. The electrical contact-connection by means of the substrate is effected between the individual chips and the circuit elements of the semiconductor device, on the one hand, and also between the semiconductor device and the external circuit elements on the other hand. The individual chips of a semiconductor device may be discrete, unpackaged chips or chips which are likewise mounted and contacted on a substrate and have different types of embodiments of a housing in the sense of an encapsulating protection. The mounting of a chip "on" a substrate also indicates the function of the substrate as a mount of the chip. It also encompasses those constructions in which the substrate has structures that are adapted to the chip and that at least partly receive the chip.

SUMMARY OF THE INVENTION

In the semiconductor device of embodiments of the present invention, the chip is completely encapsulated with only one material, with the result that the reliability and the manufacturing problems can be overcome. The impact of different coefficients of expansion, that exist between the chip and the substrate, on the warpage behavior is alleviated.

Furthermore, the device is universally applicable for differently designed chips and different techniques of first and second level interconnecting. An individual semiconductor device, package or stack is adaptable to the precise conditions and requirements, e.g., by configuring the constituent parts of the encapsulation of the chip and the package, by configuring redistribution within a semiconductor device and within a stack, by configuring a stack of bare and encapsulated chips, and by configuring the connections of individual components of the stack.

Furthermore, the device is flexible with regard to the package height, which becomes less dependent on the chip height since no potting or pressing with the chip is required as a basis. The height of the semiconductor device is determined by the height of the substrate and cover. The various known substrates can be used as a substrate and thus as encapsulation, depending on the performance parameters, usage, and application conditions, with the result that the component height can also be defined according to the mechanical stability thereof.

In the below described semiconductor device, it is possible to perform the fixing of the chip relative to the substrate and thus its contacts relative to the connections of the substrate by means of a corresponding configuration of the form of the substrate and/or cover. For this purpose, a depression-like pocket may be configured in the cover or substrate, which pocket receives the chip and thus already prepares the fixing of the chip. The pocket itself already fixes the chip laterally, such that a connection between the chip and the bearing area thereof on the substrate is not necessary. With the pocket being closed off by means of the respective other part, the chip is finally secured in its position.

Furthermore there is the possibility of adapting the constituent parts of the encapsulation to the embodiment of the chip and to the process steps for producing the semiconductor device. This may concern, inter alia, the positioning of the chip in the substrate or in the cover, or else the use of chip stacks in the package.

In an embodiment of the invention, the constituent parts of the encapsulation of the chip, i.e., the substrate with and without the pocket, the cover with and without the pockets, the requisite frames and, if appropriate, also additional frames, can be prefabricated in the size and shape respectively required. One advantage of the prefabrication is the possibility of synchronization or standardization with regard to the size of the semiconductor device. What is more, such prefabrication reduces the process steps for producing the housing to the positioning of the chip and the joining together of the two constituent parts of the encapsulation. The filling of interspaces, gaps and/or joints can then be effected, if necessary, in a process phase in which the chip has already been positioned and at least partially encapsulated, which simplifies the handling of the chip.

In another embodiment of the invention, the height of stack components can also be set and prefabricated, e.g., by way of the cover height. The prefabrication can thus involve, e.g., the connecting elements required for the stacking and electrical contact-connection of the stack components. This concerns, e.g., conduction structures on the surfaces of the cover and/or substrate, vias for through-plating of the cover, the substrate and the semiconductor device, and also aligning elements for alignment of the stack components. For the prefabrication of the cover, too, it is possible in this case to have recourse to proven methods from substrate manufacturing.

BRIEF DESCRIPTION OF THE DRAWINGS

In the accompanying drawings:

FIG. 4 illustrates a package with a semiconductor device according to FIG. 1;

FIG. 4A illustrates a package according to FIG. 4 with filled interspaces inside the package;

FIG. 5 illustrates a semiconductor device with a chip bearing face-up on a substrate;

FIG. 5A illustrates a package according to FIG. 5 with filled interspaces inside the package;

FIG. 6 illustrates a semiconductor device with a chip arranged face-down on a substrate by means of an additional frame over the substrate;

FIG. 9 illustrates a package with a semiconductor device according to FIG. 6;

FIG. 10 illustrates a semiconductor device with a chip or chip stack arranged face-down on a substrate by means of distance holders and distance elements over the substrate;

FIG. 12 illustrates a package with a semiconductor device according to FIG. 10;

FIGS. 13A and 13B illustrate a semiconductor device and a package comprising one chip, respectively;

FIGS. 14A and 14B illustrate a semiconductor device and a package incorporating one further embodiment of a chip bonded within the package, respectively;

FIG. 15 illustrates a package including two stacked bare chips;

FIG. 19 illustrates a multichip package, wherein chips are stacked by means of different components; and FIG. 20 illustrates another multichip package, wherein chips are stacked by means of different components.

DETAILED DESCRIPTION OF ILLUSTRATIVE EMBODIMENTS

Figure 1:
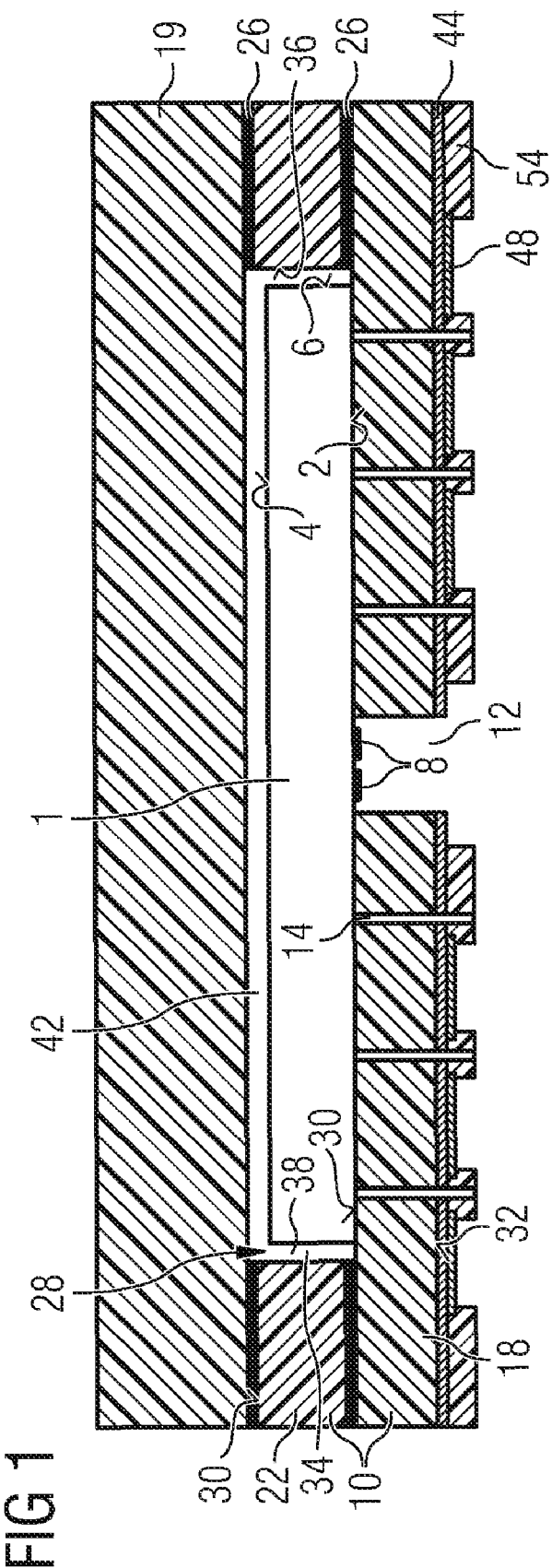
FIG. 1 illustrates a semiconductor device with a chip bearing face-down on a substrate.

A semiconductor device according to the invention comprises a chip 1 having an active side 2. Contacts of the chip 1, hereinafter referred to as chip contacts 8, are arranged on the active side 2 for making electrical contact with the latter. The side opposite the active side 2 is the rear side 4 of the chip 1 and the peripheral lateral surfaces will be referred to hereinafter as lateral faces 6. As described in the introduction, various chip stacks 1, in particular those stacked by means of TSV technology (Through-Silicon-Via technology), also have chip contacts 8 on one side of the chip stack 1, through which all the stacked chips 1 can be electrically contacted. In this case, the use of a chip stack 1 in a semiconductor device according to the invention corresponds to that of a chip 1, and so hereinafter the intention is always for a chip 1 and equally a chip stack 1 to be described in the description of a semiconductor device, a package or a component. Accordingly, the terms that describe the chip 1, i.e., the active side 2, the rear side 4, the lateral face 6 and the chip contacts 8, are also intended to describe the chip stack 1.

In one embodiment of the invention, the chip contacts 8 of the chip 1 are arranged centrally in two rows (FIG. 1). It is understood that the chip contacts 8 can be arranged in a different manner. The chip 1 is placed on a substrate 10 with its active side 2 downward, i.e., with the chip contacts 8 facing the substrate 10, such that at least part of a surface of the substrate 10 is covered by the chip 1. That side of the substrate 10 which faces the chip 1 shall hereinafter be designated as the top side of the substrate 10, irrespective of function, constituent parts or the later position of this side of the substrate 10 in the finally assembled package. Consequently, the underside of the substrate 10 is the side opposite the top side.

The substrate 10 serves, inter alia, for mounting the chip 1 and has a bonding channel 12 located centrally in the embodiment illustrated. A bonding channel 12 is a single window opening or multiple window openings in the substrate 10, the size and the shape of which permit all the chip contacts 8 to be accessible through the bonding channel 12. Furthermore, within that area which is occupied by the chip 1 (chip bearing area), the substrate 10 has a plurality of open passages serving as air vents 14. The air vents 14 prevent possible air inclusions between chip 1 and substrate 10 on account of unevenness of the two areas meeting one another. Since the two areas are not connected by an adhesive or the like, even slight unevenness of one or both areas can lead to cavities in which air and moisture remain. The air vents 14 permit air to escape and vapor expansion upon heating of the semiconductor device, e.g., in tests or under power. The air vents 14 are distributed according to the external contacts 48 that are to be realized later on in the semiconductor device and the type of integration of the semiconductor device in a relatively complex structure. They can be produced, for example, mechanically by drilling. Other methods known from the production of passages (vias) in substrate 10 for electrical contact-connection are likewise suitable.

Figure 2A:
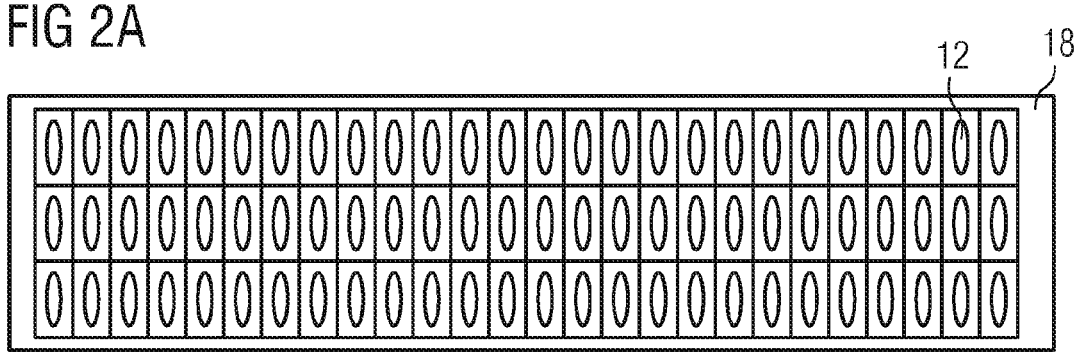
FIGS. 2A to 2C illustrate matrixes of substrates, frames and covers according to FIG. 1.
Figure 2B:
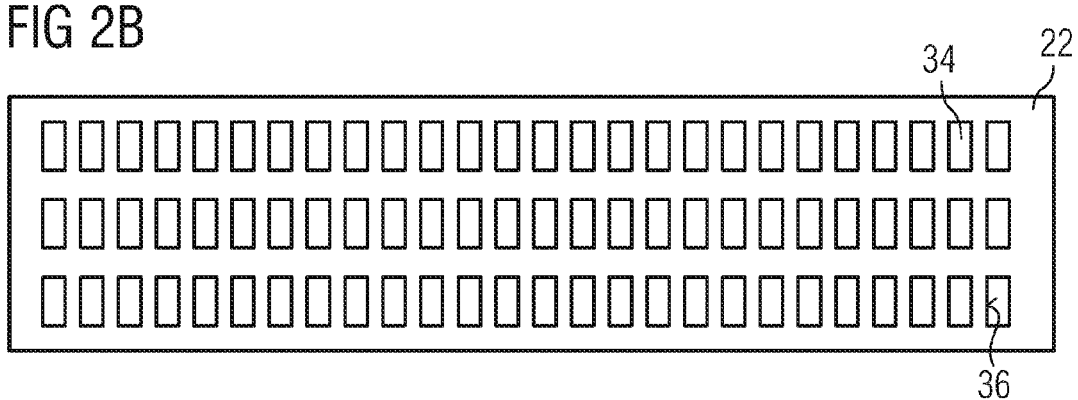

The substrate 10 in accordance with FIG. 1 is a plate-like element comprising two plates joined together in planar fashion (FIGS. 2A and 2B). The two plates may themselves in turn comprise individual layers fixedly connected to one another, as is known from laminated printed circuit board substrates composed of glass-fiber-reinforced epoxy resin (FR4). If the plates are composed, e.g., of FR4, both plates can be pressed together with one another in the same way under defined pressure and defined temperature as is known from the lamination of the substrate material. A homogenously joined substrate 10 is available in this way without the presence of a particular joining area 26, as illustrated in FIG. 1. Depending on the required mechanical, chemical and electrical properties, it is likewise possible to use other materials, both in the form of compact plates and comprising two or more plates connected to one another.

The substrate 10 has in its first side 30, i.e., the side of the substrate 10 facing chip 1, a substrate recess forming a substrate pocket 28, which, in one embodiment of the invention, is formed from a passage (frame passage 34) in the upper of the two plates, referred to hereinafter as frame 22, which ends on the second, lower plate (substrate base 18). The substrate base 18 is a plate-like element with a bonding channel 12 and air vents 14 introduced around the bonding channel 12. FIG. 2A shows a matrix of identical substrate bases 18, each of which has a bonding channel 12. The individual air vents 14 around each bonding channel 12 are not illustrated in FIG. 2A in order to provide a better overview. A matrix of frames 22, each having a rectangular frame passage 34, is illustrated in FIG. 2B.

As an alternative, the substrate pocket 28 can also be introduced into a compact substrate material by means of suitable methods. The substrate pocket 28 in accordance with FIG. 1 has a size and shape such that it completely receives and laterally fixes the chip 1. In one case, one or more joints 38 remain between the lateral face 6 of the chip 1 and the wall 36 of the substrate pocket 28. In the exemplary embodiment, a joint 38 in each case remains alongside both lateral faces 6 illustrated, the joints 38 additionally having the same width. It is likewise possible also to arrange joints 38 having different widths or only on one side. Some aspects which influence the number of joints 38 and joint widths is the lateral fixing of the chip 1 and the dimensional tolerances of chip 1 and substrate 10, since dimensional deviations can be compensated for by means of the joints 38.

As an alternative, it is also possible to configure the substrate pocket 28 in the manner precisely large enough to enable the chip 1 to be fitted in without a joint 38. Further measures for alignment and fixing of the chip 1 are not necessary in this case.

Figure 3A:
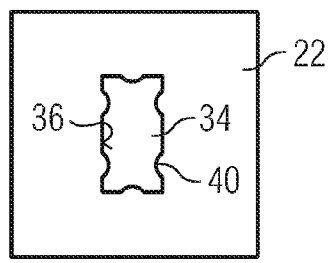
FIGS. 3A and 3B illustrate an individual frame and an individual frame matrix with lateral spacers.
Figure 3B:
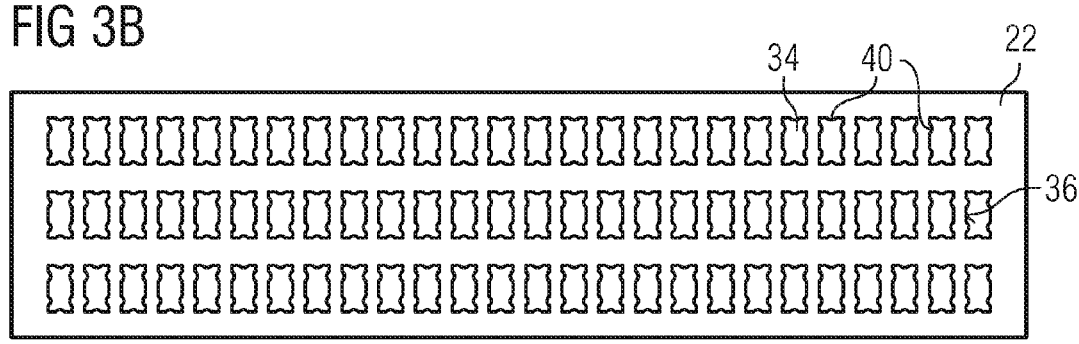

The alternative possibility of combining the lateral fixing of the chip 1 in the substrate pocket 28 through the configuration of the substrate pocket 28 with the filling of possible joints 38 or cavities exists with substrate pockets 28 in accordance with FIG. 3A. Here, lateral spacers 40, in the form of lugs which project into the frame passage 34, are formed on the walls 36 of the rectangular frame passage 34. The distance between two opposite lateral spacers 40 is precisely large enough that the chip 1 is fitted in between them and can thus be aligned and laterally fixed. Such a frame 22 can also be produced as a matrix (FIG. 3B). It goes without saying that the lateral spacers 40 can also be formed with a changed number and distribution, according to the chip geometry. What is essential is that the chip 1 can be fixed in a defined position.

Figure 2C:
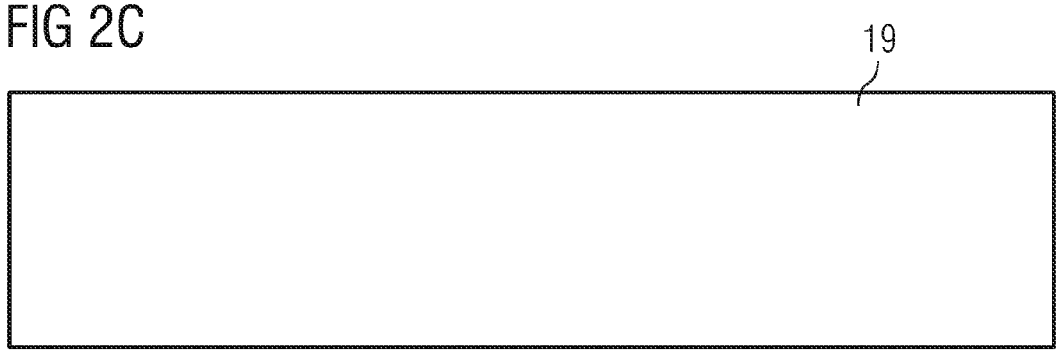
Figure 3C:
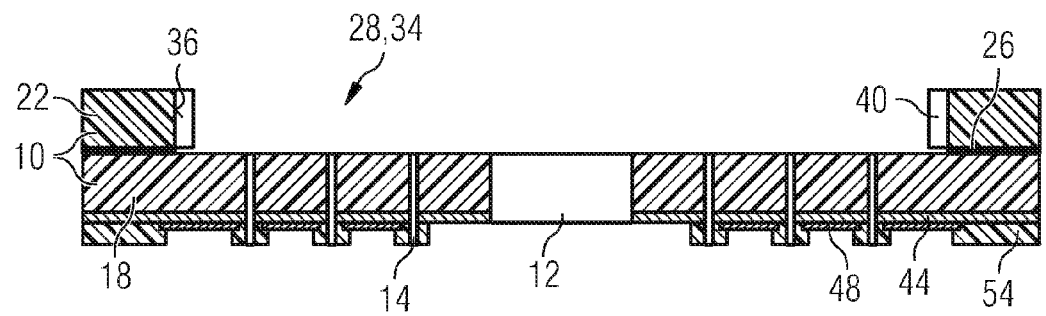
FIG. 3C illustrates a component composed of a substrate and a frame according to FIG. 1.
Figure 7A:
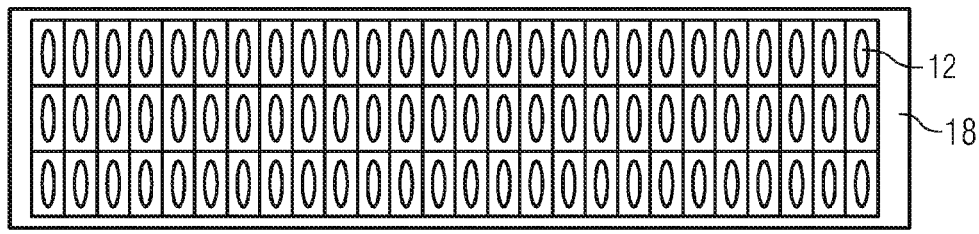
FIGS. 7A to 7E respectively illustrate matrixes of substrates, frames, additional frames and covers according to FIG. 6.
Figure 7B:
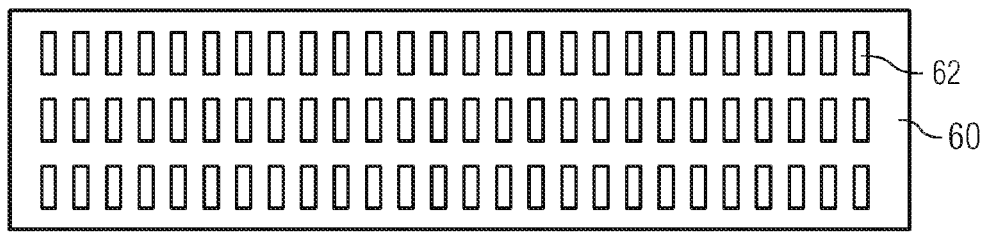
Figure 7C:
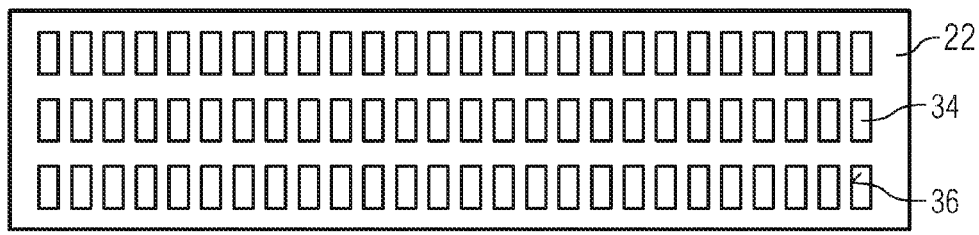
Figure 7D:
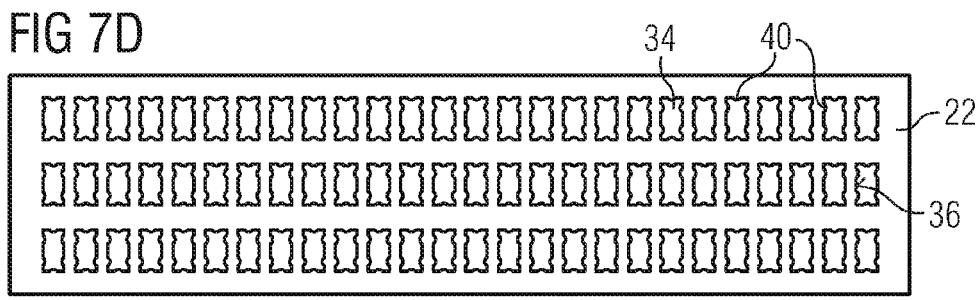
Figure 7E:

A component of a semiconductor device, comprising a substrate base 18 connected to a frame 22 in accordance with FIG. 3A, is illustrated in FIG. 3C. The substrate base 18 has a central bonding channel 12 and a plurality of air vents 14 in the chip bearing area. The component has a substrate pocket 28 formed by a frame passage 34. The lateral spacers 40 project into the frame passage 34. In a comparable manner, the frame 22 can also be connected to a plate-like element in accordance with FIG. 2c and thus form a cover 19 with a cover pocket (see FIG. 1). For further electrical connection of the chip 1, the substrate 10 comprises a redistribution layer 44 with contact pads 46, 48 on at least one of the surfaces 30, 32. A solder resist 54 is arranged above the redistribution layer 44 (see FIG. 1 and FIG. 4).

The chip 1 fixed in the substrate pocket 28 is completely encapsulated in accordance with FIG. 1 by means of a plate-like cover 19, composed of the same material as the substrate 10. For this purpose, the frame 22 has a height that is slightly greater than the height of the chip 1, and also has a plane surface onto which the cover 19 can be placed. The cover 19 and frame 22 are connected to one another. The connection can be effected by means of suitable materials and methods that do not damage the enclosed chip 1, e.g., lamination, mechanical linkage, hook-and-loop fastener or others.

On account of the height of the frame 22, there remains above the rear side 4 of the chip 1 an interspace 42 with respect to the cover 19, which interspace 42 can likewise be filled with a curable composition. This interspace 42 can also be utilized for compensating for dimensional tolerances and should be defined according to the viscosity or flowability of the filling material. Furthermore, the height of the semiconductor device can be set by way of the thickness of the cover 19.

A package based on a semiconductor device in accordance with FIG. 1 is illustrated in FIG. 4. The substrate 10 of the chip 1, which is completely encapsulated by substrate 10 and cover 19, has a redistribution layer 44, that is, e.g., made of copper, on its second side, i.e., surface 32 facing away from chip 1. The redistribution layer 44 is patterned by means of photolithographic methods, such that routing traces are formed. These routing traces of the redistribution layer 44 connect outer contact pads 46 arranged on both sides of the bonding channel 12 to external contacts 48 which are distributed in matrix-like fashion on the second side 32 of the substrate 10 and serve for connecting the package to external circuit elements, e.g., a PCB. A solder ball 50 is formed on each external contact 48. Such arrangements of external contacts 48 of a package are known as ball grid array (BGA) 51. Connecting of the package can alternatively be effected by a land grid array (LGA) where pads are used in place of the balls for the connections.

Each connection of the substrate 10 is electrically connected to a chip contact 8 by means of a wire bridge 52 through the bonding channel 12, with the result that each chip contact 8 is electrically connected to an external contact 48 by means of wire bridge 52, outer contact pad 46 and redistribution layer 44. The second side 32 of the substrate 10 including the redistribution layer 44 is covered by a protective layer 54, e.g., a soldering resist mask, the air vents 14 of the substrate 10 continuing in the protective layer 54, such that their lower terminating ends are distributed between the solder balls 50. The wire bridges 52 including the chip contacts 8 and outer contact pads 46 are encapsulated with a mold compound 56 for protection purposes.

In order to produce such a package, a substrate matrix is produced in the prefabrication composed of substrate bases 18 and frames 22 in accordance with FIGS. 2A and 2B by means of lamination, the substrate matrix having a plurality of substrate pockets 28 of the required size and shape. The plate-like cover 19 in accordance with FIG. 2c is furthermore produced.

By means of "pick and place," using a suitable tool, successively a bare chip 1 is in each case grasped and positioned centrally, face-down in the substrate pocket 28 such that the chip is laterally fixed by one of above described possibilities. By means of suitable auxiliary means, e.g., aligning openings and pins, the cover 19 is aligned with the substrate 10, placed on and left in this position for connecting substrate 10 and cover 19.

This is followed by the connection of the chip contacts 8 of the already encapsulated chip 1 by means of wire bridges 52 and the potting of the bonding channel 12 with mold compound 56. Alternatively, bonding channel 12 and wire bridges 52 can also be encapsulated by a printing process in which the composition is printed in a manner exhibiting good meterability.

Finally, the solder balls 50 are mounted onto the substrate 10 in the known manner or the required solder volume is applied in the form of a solder paste printing and reflow-soldered, whereupon the packages are singulated by separating the individual elements that are still present in the matrix from one another.

In another embodiment of the invention, as shown in FIG. 4A, the chip 1 is fixed by filling the joint 38 or the joints 38 with curable material. The material may be e.g., a potting compound or an adhesive. If an adhesive is used, the application of adhesive to the plate-like cover 19 (FIG. 2c) which is adhesively bonded to the substrate 10 in order to close off the substrate pocket 28, and also the introduction of the adhesive into the joint 38 or the joints 38 for the filling thereof, can be effected in one work step. In this case, the joint width should be coordinated with the viscosity of the material for filling, such that the joint 38 is completely filled without giving rise to undesirable cavities within the joint 38. If the viscosity of the filling material is higher, the joint width must be larger.

In another embodiment of the invention, as shown in FIG. 5, a substrate 10 is embodied from a substrate base 18 and a frame 22 in the manner described above and has a substrate pocket 28. A chip 1 is arranged face-up, i.e., with its active side 2 upward in the substrate pocket 28. The substrate base 18 comprises air vents 14 in the chip bearing area, for carrying away air and water vapor from cavities which are possibly present between chip 1 and substrate base 18 and which may result from unevenness of the areas lying on one another.

The chip contacts 8, which are arranged in two individual rows on two opposite outer edges of the chip 1 in the example illustrated, are electrically connected to the outer contact pads 46 of the substrate 10 by means of wire bridges 52. As illustrated in FIG. 5, the outer contact pads 46 are arranged within the substrate pocket 28 on the first side 30, i.e., facing the chip 1, of the substrate 10. An electrical connection of the outer contact pads 46 to external contacts 48 lying outside the encapsulation can be realized using known means and methods. By way of example, a connection by means of metallized vias 15 and conductor track structures 44, as described above, is suitable.

In this example, the size of the substrate pocket 28 is chosen, at least in one dimension, such that the required space is available for the arrangement of the outer contact pads 46 in the substrate pocket 28 and the production of the wire bridges 52. In this exemplary embodiment, too, a fixing of the chip 1 is effected by fitting the chip 1 into a substrate pocket 28 adapted to the chip size in the direction of extent that is perpendicular to the plane of the drawing by lateral spacers 40 (see FIG. 3C) on the wall 36 of the substrate pocket 28, which extend to the lateral faces 6 (see FIG. 1) of the chip 1 on which no wire bridges 52 are to be produced, or by filling the joints 38 between the wall 36 of the substrate pocket 28 and the lateral faces 6 of the chip 1 and/or interspaces 42 between chip 1 and cover 19 (FIG. 5A). A combination of these measures is also possible. Lateral spacers 40 which project into the frame passage 34 and rest on the chip corners are likewise suitable for fixing an arbitrary chip 1 (see FIG. 1). The substrate pocket 28 can likewise be closed off by lamination of cover 19 and substrate 10 by means of high pressure using resins.

In this embodiment of the invention, too, a chip stack 1 can be encapsulated instead of the individual chip 1, in which case, by means of a suitable one of the stacking technologies described in the introduction, the wire bridges 52 of each individual chip 1 can be produced either from chip 1 to chip 1 or directly from the chip 1 to the substrate 10, if appropriate while maintaining distances. In this case, too, the height of the frame 22, the shape of the substrate pocket 28 and, if appropriate, the arrangement of lateral spacers 40 on the wall 36 of the substrate pocket 28 is to be adapted to the chip stack 1 and the course of the wire bridges 52.

In an embodiment according to FIG. 5A, before the semiconductor device is closed off by adhesively bonding a plate-like cover 19 on the frame 22 by means of, e.g., an adhesive layer 26, the substrate pocket 28 is filled with a curable composition, e.g., molding compound 56.

In a further embodiment of the invention shown in FIG. 6, a substrate pocket 28 is modified by insertion of an additional frame 60 between frame 22 and substrate base 18. The additional frame 60 has a second passage 62, which deviates from the frame passage 34 in terms of its geometry. The additional frame 60 is intended to produce a gap 64 between the chip 1 and first side 30 of the substrate 10 by virtue of the outer edges of the chip 1 bearing on sections of the additional frame 60 at least in sections. For this purpose, the second passage 62 lying below the frame passage 34 is to be configured in such a way that it projects into the chip bearing area at least three locations.

In the exemplary embodiment illustrated, the second passage 62 has the same shape as the frame passage 34, but is reduced in size, such that the chip 1 bears by the outer edges of its active side 2 over the entire circumference in a defined manner on the additional frame 60, which therefore represents a distance piece with respect to the substrate 10. This means that virtually the entire active side 2 of the chip 1 has a defined gap 64 with respect to the substrate 10.

In the case of a substrate 10 produced in this way, too, substrate base 18, additional frame 60 and frame 22 are joined together in the manner described above in such a way that a compact uniform device with a substrate pocket 28 is available.

The above-described geometrical relationship between frame passage 34, second passage 62 and chip 1 has the effect that during a later filling of the joints 38 between the lateral faces 6 of the chip 1 and the wall 36 of the substrate pocket 28, no filling material penetrates into the gap 64 under the chip 1. It is thus possible to configure the filling of the joints 38 independent of whether the gap 64 is filled or not. By contrast, if the chip 1 does not bear on the additional frame 60 over the entire circumference and there are therefore spatial connections between lateral joint 38 and lower gap 64, it is possible to prevent the penetration of the filling material of the joint 38 into the gap 64 by means of its sufficiently high viscosity. Also, it is possible to completely prevent the filling of both of the cavities 38 and 64, or to fill both cavities equally. Additionally, it is made possible to merely ensure during the process that the filling material of the joint 38 does not cover the contacts 8 of chip 1 prior to contacting thereof, and the material does not flow away through the gap 64 and the bonding channel 12.

With regard to the geometry of the frame passage 34, the fixing of the chip 1 in the frame passage 34, the filling of joints 38 and interspace 42 between chip 1 and cover 19, the same statements as were made with regard to the exemplary embodiment in FIG. 1 hold true, whereby reference is to be made to the explanations in respect thereof.

Reference may be made to the above explanations also with regard to a package produced from a semiconductor device in accordance with FIG. 6 and FIG. 9, and with regard to the production thereof. Cavities which are above and beside the chip 1 can be filled or unfilled. The gap 64 between chip 1 and substrate base 18 according to FIG. 9 has the effect that, during the filling of the bonding channel 12, the gap 64 is filled at the same time. On account of the high stiffness of the cured mold compound 56, the position of the chip contacts 8 is then fixed relative to the position of the outer contact pads 46 since the cured mold compound 56 prevents warpage of the chip 1.

In order to avoid warpage of the chip 1 up to this point in time, e.g., in the course of producing the wire bridges 52, in one embodiment of the invention shown in FIG. 9, distance elements 66 are arranged at exposed locations in the gap 64, e.g., adjacent to the bonding channel 12, which distance elements 66 maintain the gap width even under a mechanical load. Depending on the chip size, it is possible for further distance elements 66 to be arranged in a manner distributed over the chip bearing area in order to ensure the necessary vertical fixing of the chip 1 over its entire area until the curing of the filling composition. In order that, with the distance elements 66 on the chip bearing area as well, no further materials penetrate into the semiconductor device or into the package, it is advantageous if the distance elements 66 are produced from small portions of filling composition or alternatively from substrate material. If they are composed of substrate material, they are to be included in the prefabrication of the substrate 10. By contrast, if they are composed of filling composition, they are introduced into the substrate pocket 28 and cured prior to the positioning of the chip 1. It goes without saying that the distance elements 66 can also be composed of other materials whose thermal and chemical behavior is comparable to that of the substrate 10 or the filling composition, since the volume of the distance elements 66 makes up only a fraction in comparison with the volumes of the filling composition and the substrate 10.

Even though the chips 1 are arranged face-down in the semiconductor device in FIGS. 6 and 9, it is likewise possible, in principle, through corresponding configuration of the additional frame 60, to produce a spacing between substrate base 18 and chip 1 and in this case, in the manner comparable to the semiconductor device in FIG. 5, to arrange the outer contact pads 46 within the second passage 62, i.e., the passage of the additional frame 60.

The individual constituent parts of a semiconductor device in accordance with FIG. 6 in the form of a matrix that serves for the effective production of a relatively large number of semiconductor devices with the use of corresponding tools that process a plurality of elements simultaneously are illustrated in FIGS. 7A to 7E. The substrate base 18 (FIG. 7A), the frame 22 (FIG. 7C), the cover 19 (FIG. 7E) and the frame with lateral spacers 40 (FIG. 7D) are adapted to the chip 1 with regard to their size, if appropriate, in a manner comparable to those in FIGS. 2A to 2C and 3B. The additional frame 60 (FIG. 7B) is additionally inserted, the second passages 62 of the additional frame having the rectangular form of the frame passages 34 (FIGS. 7C and 7D) but being reduced in size by a defined factor. The position of the second passages 62 is defined on the matrix of the additional frame 60 such that when the two frames 22, 60 are placed one on top of another, each frame passage 34 and second passage 62 lie concentrically with respect to one another.

Figure 8:
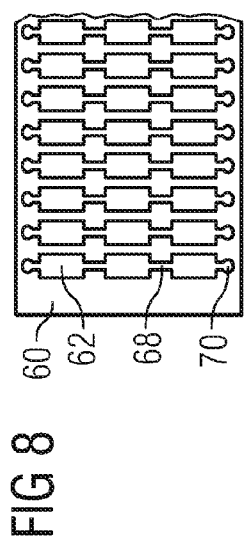
FIG. 8 illustrates an embodiment of a frame matrix according to FIG. 7C.

An embodiment of a matrix of additional frames 60 is illustrated in FIG. 8. In this matrix, the second passages 62 of a column, i.e., second passages 62 lying one below another in the drawing plane of the illustration, are connected to one another by channel-like connections 68, which in turn open into cavities 70 at the beginning and at the end of each column. This embodiment makes it possible for the second passages 62 connected in this way, in the incorporated state of the package, to be filled by only one filling operation and in this case for the air to be displaced into the cavities 70, with the result that the filling composition in the package is free of voids. This embodiment likewise makes it possible to increase the reliability since, as explained above, undesirable cavities, e.g., under thermal loading, can lead to damage to the package.

Figure 11A:
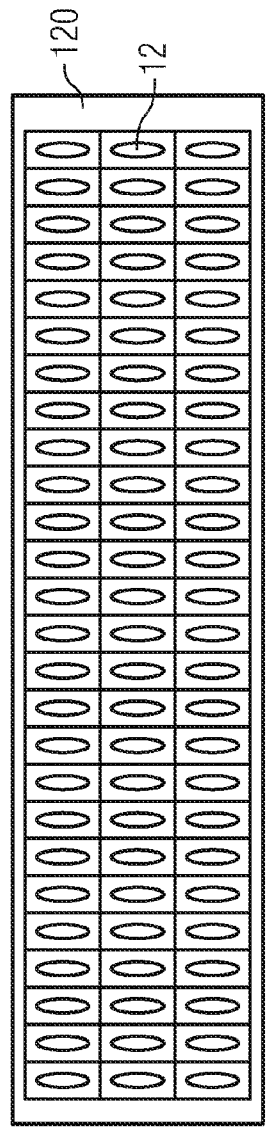
FIG. 11A illustrates a substrate matrix according to FIG. 10 with bonding channels.
Figure 11B:
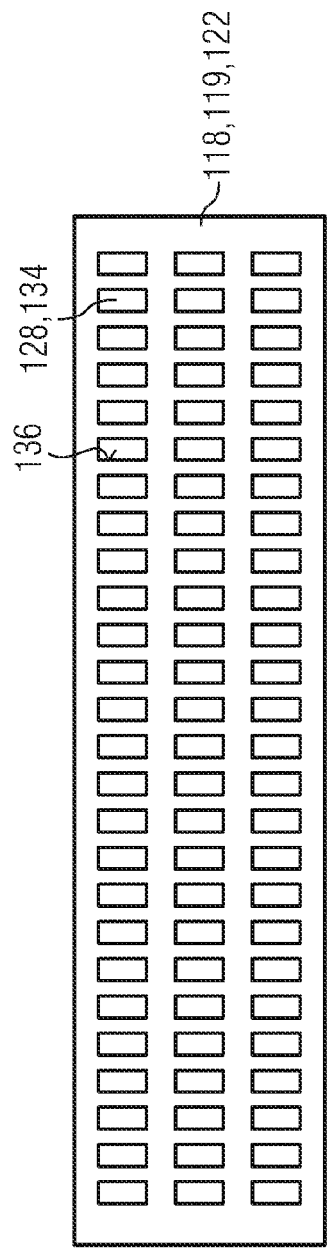
FIG. 11B illustrates a frame matrix with cover pockets according to FIG. 10.

In an alternative embodiment of the invention, the pocket is arranged in the cover 119 (cover pocket 128). The cover 119 in accordance with FIG. 10 is, in a manner comparable to the substrate 10 in FIG. 1, a plate-like element comprising two plates joined together in a planar manner (FIG. 11B in the joined-together state). The substrate 120 comprises a plate, in a manner comparable to the cover 19 in accordance with FIG. 1. Since the cover material corresponds to that of the substrate 120, the two plates of the cover 119 themselves can likewise comprise individual layers fixedly connected to one another, as is known from laminated printed circuit board substrates composed of glass-fiber-reinforced epoxy resin (FR4). If the plates are composed, e.g., of FR4, both plates can be pressed together with one another in the same way under defined pressure and defined temperature (lamination). A homogeneously joined cover 119 is available in this way without the presence of a particular joining area 126, as illustrated in FIG. 10. Depending on the required mechanical, chemical and electrical properties, it is likewise possible to use other materials for the substrate 120 and thus also for the cover 119, both in the form of a compact cover and a cover comprising two or more plates connected to one another.

The cover 119 has in its first side a cover pocket 128, which, in one embodiment of the invention, in a manner comparable to the substrate pocket 28, is formed from a passage (frame passage 134) in the lower plate, referred to hereinafter as frame 122. The frame passage 134 ends on the second, upper plate (cover base 118). FIG. 11B shows a matrix of identical cover bases 118. A matrix of substrates 120, each of which has a bonding channel 12, is illustrated in FIG. 11A.

As an alternative, the cover pocket 128 can also be introduced into a compact cover material by means of suitable methods. The cover pocket 128 in accordance with FIG. 10 has a size and a shape such that it can completely receive the chip 1 and in this case one or more joints 138 remain between the lateral face 6 of the chip 1 and the wall 136 of the cover pocket 128, which, e.g., has the same width at all points. Alternatively, it is possible to arrange joints 138 having different widths or only on one side. One aspect which influences the number of joints 138 and joint width is the lateral fixing of the chip 1 and the dimensional tolerances of chip 1 and substrate plate 120 since dimensional deviations can be compensated for by means of the joints 138.

In one embodiment of the invention, the chip 1 is inserted into the cover pocket 128 with its rear side 4 facing the cover base 118 and is aligned in the process. The alignment of the chip 1 serves for positioning its chip contacts 8 relative to predefined reference points of the semiconductor device for their later automated connection to the outer contact pads 46 of the substrate plate 120. In one embodiment, the precisely aligned chip 1 is fixed by means of an adhesive connection between the rear side 4 of the chip 1 and the cover base 118. The adhesive connection is realized by means of an application of an adhesive layer 58 prior to the insertion of the chip 1 or preferably by means of an adhesive tape. The use of a tape is a known connecting technology for chip 1 (die bonding) and permits the prefabrication of the chip 1 with the tape. An application of adhesive can be effected, e.g., by means of apportioned individual application (dispensing).

As an alternative or in addition to fixing by means of an adhesive connection on the rear side 4 of the chip 1, the chip 1 can also be fixed by filling the joint 138 or the joints 138 with curable material (not shown). This material may likewise be mold compound, such as mold compound 56 of FIG. 12). The viscosity of the material for filling and the width of the joints 138 between chip 1 and the wall 136 of the cover pocket 128 should be coordinated very precisely with one another, such that the joint 138 is completely filled without giving rise to undesirable cavities within the joint 138 and without filling composition passing between chip 1 and substrate plate 120. If the joint width is larger, the viscosity of the filling material must be higher.

On account of a fixing of the chip 1 by means of adhesive layer 58, there is an interspace 142 between chip 1 and cover base 118, which interspace 142 is filled with the adhesive 58. In one embodiment of the invention, a distance piece formed from an additional frame 60 between cover base 118 and frame 122, and in another embodiment distance elements 66 composed of mold compound 56 or the cover material, are arranged in order to ensure a uniform interspace 142. For the implementation, reference is made to above explanations of FIGS. 6 and 9.

As an alternative or in addition to the fixing by means of an adhesive connection of the rear side 4 of the chip 1, it is also possible to configure the cover pocket 128 in a manner precisely large enough that the chip 1 can be fitted in without a joint 138. Measures for aligning the chip 1 are not necessary in this case. As an alternative to the fitting accuracy of chip 1 and cover pocket 128, in this case as well as lateral spacers in the form of lugs which project into the frame passage 134, as already explained above can be formed on the walls 136 of the frame passage 134.

The components of a semiconductor device that are to be joined together in accordance with FIG. 10 therefore comprise a cover 119 with cover pocket 128 and a plate-type substrate 120 having a bonding channel 12 in a manner corresponding to the arrangement of the contacts 8 of chip 1.

In accordance with FIG. 10, the chip 1 fixed in the cover pocket 128 is completely encapsulated by means of a plate-like substrate 120 composed of the same material as the cover 119. For this purpose, the frame 122 has a height that is slightly larger than the height of the chip 1, and also has a plane surface onto which the substrate plate 120 can be placed. Substrate 120 and frame 122 are connected to one another. The connection of frame 122 and substrate 120 may be effected by means of suitable materials and methods that do not damage the enclosed chip 1, e.g., by means of lamination by resin or by suitable mechanical linkage.

On account of the height of the frame 122 there remains below the active side 2 of the chip 1 a gap 164 with respect to the substrate plate 120, which gap can be filled with a curable composition. In order to adjust the height of the gap 164, distance holders 160 are arranged in the region of the outer edges of the chip 1. In one embodiment of the invention, the distance holders 160 are produced from mold compound that fills the joints 138 between chip 1 and cover pocket 128. For this purpose, the quantity of a mold compound was adjusted such that part of it projects beyond the active side 2 of the chip 1 in the region of its outer edges and thus forms the distance holders 160 after curing. Distance elements 166 may be arranged in the above-described manner and distributed on the active side 2 of the chip 1 in order to ensure the height of the gap 164 over the whole area even under a mechanical load.

In this embodiment, too, the gap 164 can be utilized for compensating for dimensional tolerances and the height of the semiconductor device can be adjusted by way of the thickness of the cover 119.

A package based on a semiconductor device in accordance with FIG. 10 is illustrated in FIG. 12. The substrate 120 of the completely encapsulated chip 1 has a redistribution layer 44, that is, e.g., made of copper, on its second side, i.e., the surface 132 facing away from chip 1. The redistribution layer 44 is patterned by means of photolithographic methods. The redistribution layer 44 connects outer contact pads 46 arranged on both sides of the bonding channel 12 to external contacts 48 which are arranged in a matrix-like fashion on the second side 132 of the substrate plate 120 and serve for connecting the package to external circuit elements, e.g., a PCB, and are distributed as an array. Contacted with the array of external contacts 48, there is a solder ball 50 for producing a BGA 51.

Each outer contact pad 46 of the substrate plate 120 is electrically connected to a chip contact 8 by means of a wire bridge 52 through the bonding channel 12, such that each chip contact 8 is electrically connected to an external contact 48 by means of wire bridge 52, outer contact pad 46 and conductor track 44. The second side 132 of the substrate plate 120 including the redistribution layer 44 is covered by a protective layer 54, e.g., a solder resist mask. The wire bridges 52 including chip contacts 8 and outer contact pads 46 are encapsulated with a mold compound 56 for protection purposes. In an embodiment, the mold compound 56 also completely fills the gap 164 between chip 1 and substrate 120. The viscosity of the filling material should be defined according to the gap height in order to obtain complete filling of the gap 164. If the distance holders 160 and distance elements 166 are produced from the same mold compound, the gap 164 is filled with only one material.

In order to produce such a package, a cover matrix (FIG. 11B) is produced in the prefabrication comprising cover bases 118 and frames 122 by lamination of both plates, the cover matrix having a plurality of cover pockets 128 of the necessary size and shape. Furthermore, the substrate plate 120 is produced with the bonding channels 12 in accordance with FIG. 11A.

By means of "pick and place," using a suitable tool, a respective bare chip 1 having a tape on its rear side 4 is successively grasped and positioned centrally with its rear side 4 facing cover base 118 in the cover pocket 128. Afterwards, the joints 138 are filled by means of filling compound and distance holders 160 are simultaneously produced in the region of the outer edges of the chips 1, the distance holders 160 terminating with the first side 150, the one facing chip 1, of the cover 119. Furthermore, distance elements 166 made of filling compound are applied on the active side 2 of the chip 1 and adjacent to chip contacts 8, the height of the distance elements 166 matching that of the distance holders 160 within the scope of the required tolerances. Thereafter, the substrate 120 is aligned with the cover 119 by means of suitable auxiliary means, e.g., aligning openings and pins, placed thereon and left in this position for connecting the cover 119 and substrate 120 as described above.

This is followed by connecting chip contacts 8 of the already encapsulated chip 1 by means of wire bridges 52 and potting of the bonding channel 12 and of the gap 164 with mold compound 56. If in another embodiment the gap 164 remains unfilled, the substrate 120 comprises vents 14 as described above.

Finally, for producing a BGA, solder balls 50 are attached in the known manner by the application of solder portions and the heating thereof, whereupon the packages are singulated by separating the individual elements that are still present in the matrix from one another.

In one embodiment of the invention, the second side 152 of the cover 119, the surface facing away from chip 1 and therefore being situated on the exterior, is patterned such that it is enlarged. Such surface enlargement proves to be favorable for better heat dissipation, for example, in which case, in a further embodiment, a layer whose material improves a heat transfer is deposited on the second side 152. It goes without saying that such a patterning of the second side 152 of the cover 119 situated on the exterior is not restricted to those semiconductor devices which have a cover pocket 128. Plate-like covers 19 in accordance with FIG. 1, 5 or 6 may also comprise this modification.

The substrates 10 of the semiconductor devices and packages in accordance with embodiments of the invention illustrated in FIGS. 13A and 13B as well as 14A and 14B also include a plate such as illustrated and described above with reference to FIG. 1, each comprising two plates, a substrate base 18 and a frame 22, joined together in planar fashion. Frame passage 34 and substrate base 18 cooperatively define a substrate pocket 28 that may receive chip 1 entirely and affix it. As to the materials and formation of the substrates 10 as well as substrate pockets 28, reference is made to the discussion in conjunction with FIG. 1.

In one embodiment of the invention, substrate base 18 has a redistribution layer 44 on each side, i.e., routing traces of a highly conductive metal, e.g., copper, including contact pads 45, 48 for providing for a possible solder connection. The redistribution layer 44 is covered by solder resist 98 exposing the contact pads 45, 48. Additionally, substrate base 18 has, in its central portion and hence in the area of substrate pocket 28, several vias 15, extending through substrate 10 from the first side 30 of the substrate facing chip 1 to the opposite, second side 32 of the substrate 10. A via 15 refers to a plated-through hole used as a through connection. By a redistribution layer 44 of both sides electrically connected to vias 15 and through vias 15, the inner contact pads 45 of the first substrate surface 30 are electrically connected with outer contact pads 48 of second substrate surface 32. Redistribution layers 44 serve for electrically connecting outer and inner contact pads 48, 45 of the substrate 10 to vias 15 and may as well be replaced by other means producing an electrical connection with the required characteristics, such as by wire bridges or by directly connecting vias 15 with contact pads 45, 48.

In the illustrated embodiment according to FIGS. 13 and 14 vias only extend through substrate base. However, depending on the various requirements for the device, e.g., as a stack component, vias may similarly extend through the substrate in the area of the frame for realizing through contacting through the frame and the substrate base. Also, an offset of electrical through contacting of vias is possible, by a via beginning in the frame and continuing in the substrate base and both vias being electrically connected to each other through a redistribution layer on the surface of the substrate base on which the frame is disposed.

In one embodiment of the invention (FIGS. 13 and 14) chip 1 is arranged face-down in substrate pocket 28, and substrate pocket 28 is covered with a plate-like cover 19. Since substrate pocket 28 is slightly larger than chip 1, both in terms of its height and its lateral dimension, this leaves one or more joints 38 alongside chip 1 and one or more joints and an interspace 42 along rear side 4. In several embodiments of the invention, the joints 38 and the interspace 42 are unfilled (FIG. 14) or entirely filled with a curable mold compound (FIG. 13). As for the fixation of a chip 1 in a substrate pocket 28, joining substrate 10 to cover 19, and methods for realization of the same as well as for filling materials for joints 38 and interspace 42, reference is made to the discussion above.

Chip 1 illustrated in embodiments according to FIGS. 13 and 14 has planar distributed chip contacts 8 on its active side 2. The position of inner contact pads 45 on the first substrate surface 30 corresponds to the position of chip contacts 8, such that chip 1 may be arranged by flip chip bonding above first substrate surface 30.

Gap 64, that is present due to the spatial extent of a solder connection of flip chip bonding between chip 1 and substrate base 18, is in one embodiment entirely filled with a resist mask 80 (FIG. 13A and FIG. 13B). Thereby all cavities between chip 1 and substrate 10 as well as cover 19 of the encapsulation within substrate pocket 28 are completely filled with material, the thermal, chemical and mechanical characteristics thereof being adaptable to each other as well as to the uniform material of the encapsulation.

Generally, vias 15 can be formed as through holes, i.e., opening to both sides, with an electrically conductive coating of the wall at least in sections. It is also possible in the embodiment described to entirely seal vias 15 or through holes with metal or with other appropriate material, if material interfaces within the encapsulation have defined conditions also under thermal or mechanical load, e.g., if the semiconductor device within the encapsulation has no cavities (FIG. 13), in which moisture or gases could gather that could affect the reliability of the semiconductor device.

In another embodiment of the invention, resist mask 80 fills the gap 64 between chip 1 and substrate base 18 only to the extent to leave an air film 82 in gap 64 that extends parallel to the active side 2 of the chip (FIGS. 14A and 14B). In FIGS. 14A and 14B, resist mask 80 is disposed on base substrate 18 and air film 82 is disposed above resist mask 80. It is likewise possible to arrange resist mask 80 above air film 82 and hence adjacent to chip 1. In this embodiment, apart from vias 15, vents 14 are provided as an open passage that continues into any additional adjacent layer formed on substrate base 18. In this way, air film 82 within the encapsulation is in fluid communication with the surrounding atmosphere, whereby, e.g., an expanding gas may escape from the remaining cavity in the encapsulation.

A package comprising a semiconductor device of the invention additionally has external contacts 48 on the second substrate surface 32 that allow integration of the package into an external circuit. In embodiments according to FIGS. 13B and 14B solder balls 50 arranged on outer contact pads 48 of the substrate as Ball Grid Array 51 serve as external contacts 48. Likewise, other external contacts could be provided depending on the integration method in question.

In one embodiment of the invention, a semiconductor device and a package based thereon comprise a stack of bare chips instead of a single chip 1 (FIG. 15). The at least two chips 1 to be stacked are stacked by through silicon bonding. The chips 1 have chip through-contacts 84 arranged in the area of chip contacts 8, for electrical contacting and for mechanical coupling with each other. The through-contacts 84 are exposed on active side 2 and on rear side 4 in the form of metal plugs. Metal plugs 84 are interconnected and electrically contacted by means of a solder connection, such that each chip contact 8 of chip stack 1 in an assembly is mapped as a stack contact 86 on the active side 2 of chip stack 1 and is electrically contacted there in a way as described above for a single chip 1. If necessary, chip contacts 8 of a chip 1 within the stack are distributed, by appropriate redistribution within the stack in such a way that mapping all chip contacts 8 on the active side 2 of chip stack 1 is possible also for complex configurations of chip contacts 8. A chip interspace 88 between the chips 1 of a stack is, in one embodiment, filled with an appropriate underfill material.

For the configuration of a chip stack 1 the individual constituent components of the encapsulation, e.g., frame 22, have a height corresponding with the height of the stack, such that chip 1 is completely encapsulated by covers 19, 119 and substrate 10 as described above. As for the fixation of chip stack 1 in a substrate pocket 28 or cover pocket 128 of a semiconductor device, as well as joining of substrate 10 and covers 19, 119 and methods for realizing the same, and for filling materials for joints and the interspace, reference is made to the discussion above.

In an alternative to the through silicon technology illustrated in FIG. 15 and to a face-down configuration of a chip stack, other stack designs may be arranged in a semiconductor device and package of the invention. Contacting of individual chips 1 by wire bridges, face-up positioning of chip stack 1 or alternate positioning face-down and face-up within a chip stack 1 are also possible. If, in one of the alternative embodiments mentioned above though not illustrated in detail, a cavity remains within a closed encapsulation, a fluid communication between the cavity and the surrounding atmosphere is provided as described above by open vents 14 in substrate 10, for tension release for the cavity, e.g., upon thermal load. Alternatively, positioning of a chip stack 1 of bare chips in such semiconductor devices as described above with bonding channel 12 is also possible.

FIGS. 18A to 18E illustrate embodiments of components for a semiconductor device, comprising a substrate base 18 coupled to a frame 22. It is known that substrates 10 may be composed of several layers to realize specific mechanical or electrical characteristics or electrical features. Therefore, the constituent parts of the inventive components may also be made up of several layers.

Substrate base 18 has a plurality of vias 15 in the chip support surface that are defined as open passages with an electrically conductive wall. Vias 15 are electrically connected with inner and outer contact pads 45, 48 of substrate 10 through routing traces of a respective redistribution layer 44 on the first and second sides 30, 32 of substrate base 18. Alternatively, vias 15 for electrical connections and vents 14 for fluid communication between any cavities within the package and the surrounding atmosphere can be formed in one substrate 10. The component has a substrate pocket 28 formed by frame 22 having a frame passage 34 (not shown). In one embodiment of the invention, frame 22 is joined to substrate base 18 under defined pressure and defined temperature.

In another embodiment of such a component, spacers 40 (FIG. 18B) project from wall 36 of frame 22 into frame passage 34 (not shown) ensuring lateral fixation of chip 1 (not shown). Alternatively or in addition to spacers 40 for lateral alignment, a component may also have at least one distance element 66 (not shown) formed by an additional frame 60. The additional frame 60 includes a second passage 62, the outline thereof essentially corresponding with that of frame passage 34 and projecting into substrate pocket 28 at least in sections, such that a chip 1 positioned in substrate pocket 28 rests upon additional frame 60 at least with portions of its outer edge. In this way, second passage 62 defines gap 64 (not shown) between chip 1 and substrate base 18. The height of the gap 64 is adaptable through the height of additional frame 60.

Figure 18A:
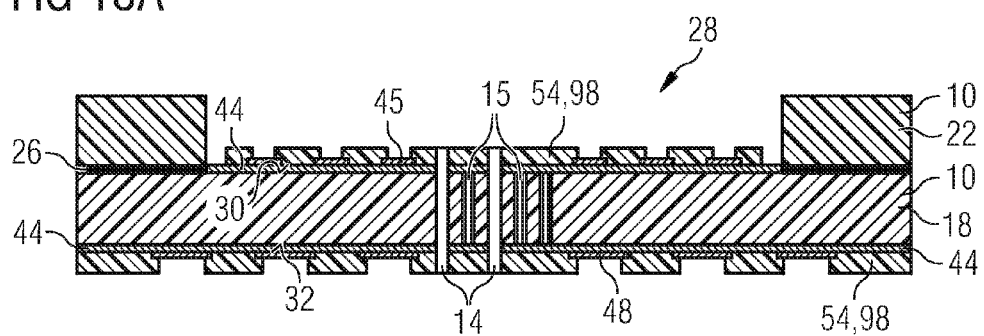
FIGS. 18A to 18E illustrate different embodiments of components composed of a base and a frame.
Figure 18B:
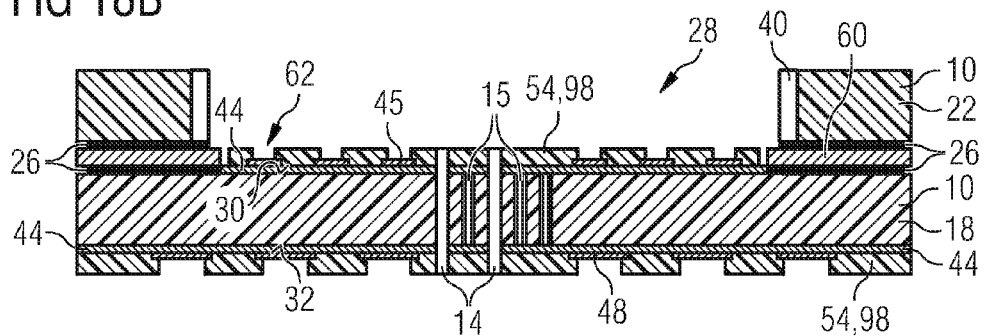

In FIGS. 18A to 18B, vias 15 are arranged in a central area of substrate pocket 28. Alternatively they may be distributed throughout substrate pocket 28 (FIG. 18C) or may be provided below frame 22 or additional frame 60, respectively (FIGS. 18D and 18E). If a fluid communication between an air film 82 or a cavity within the encapsulation of a package to the surrounding atmosphere is to be produced and if open vias 15 or vents 14 are arranged below frame 22 or additional frame 60, then passages 90 are formed in frame 22 that provide the required fluid communication. The passages may end in the outer wall of frame 22 or additional frame 60, e.g., or may be connected to an open via 15 or vent 14 in substrate base 18 (FIG. 18E).

Figure 18C:
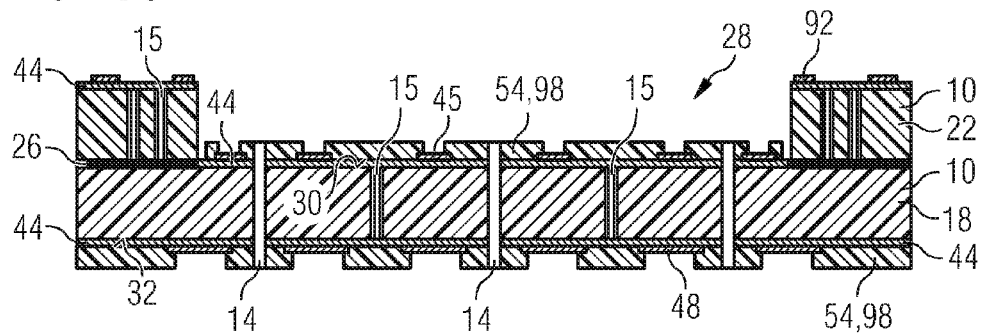
Figure 18D:
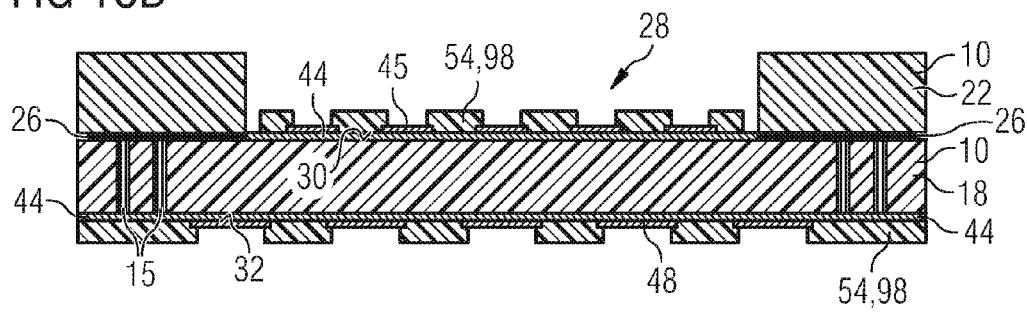
Figure 18E:
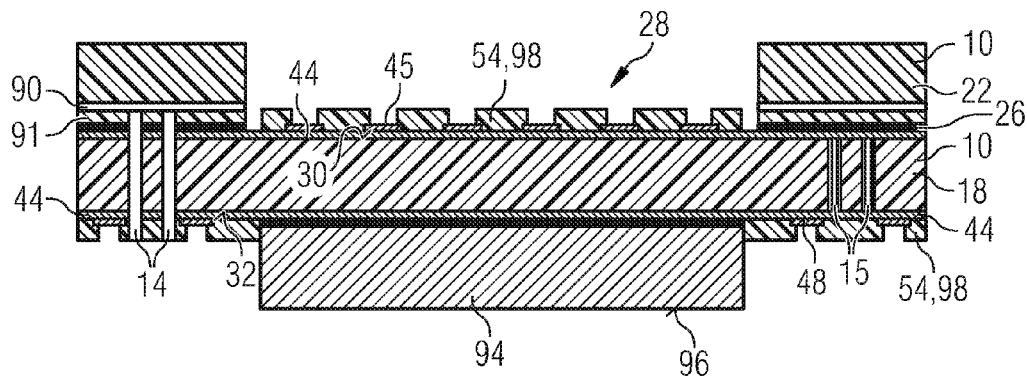

In additional or alternative embodiments, components include vias 15 in frame 22 or additional frame 60 that are electrically connected with a redistribution layer 44 on substrate base 18 and another redistribution layer 44 on its surface facing away from substrate base 18 (FIG. 18C). By appropriately structuring redistribution layer 44 it is possible to provide an electrical connection from contact pads 92 of the frame up to outer contact pads 48 on the second side 32 of substrate 10.

For stacking completely encapsulated chips 1 (FIGS. 16 and 17) or modified packages according to the invention that will be explained later, one embodiment of a component includes a protuberance 94 on its second side (FIG. 18E) that serves as a spacer means within the stack. Protuberance 94 is coupled to substrate base 18 and is made up of the same material as the remaining constituent parts of the encapsulation. In one embodiment, the protuberance 94 corresponds in size and shape at least to the rear side of a chip 1 and leaves an area in the peripheral area of substrate base 18 that is required for electrically connecting the stack components.

The embodiments of the components described above may be provided both as a substrate 10 and as a cover 119, by providing a substrate pocket 28 or a cover pocket 128 in base and frame, respectively, and by appropriately defining electrical connections or by appropriately contacting. A fluid communication between cavities or air films 82 within the encapsulation and the surrounding atmosphere may also be realized through vias within cover 119 that will not be explained in detail.

Figure 16:
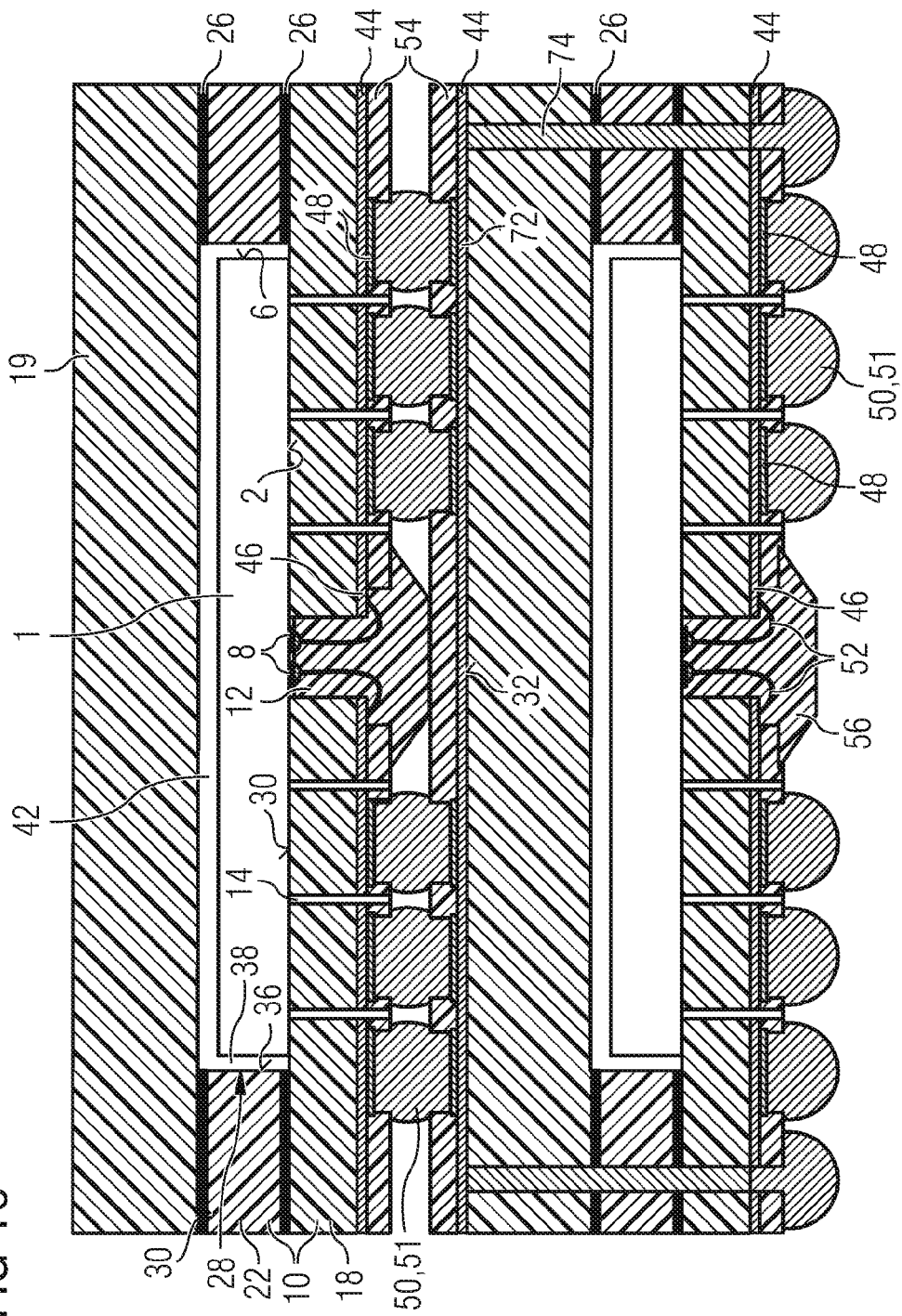
FIG. 16 illustrates a package-on-package stack comprising two packages according to FIG. 1, each comprising one chip.

The invention likewise encompasses a stack of at least two packages each comprising a semiconductor device according to the invention. In accordance with one embodiment, two BGA packages are stacked, in each of which a chip 1 is arranged face-down in the substrate pocket 28 of a semiconductor device and is electrically contacted by means of a bonding channel 12 in the substrate 10 (FIG. 16). The external contacts 48 of the package are provided in the form of ball grid arrays 51 that are electrically connected by means of a redistribution layer 44 to the outer contact pads 46 of the semiconductor device and these are in turn electrically connected by means of wire bridges 52 to the chip contacts 8. The further configuration of the individual semiconductor devices of each stack component corresponds, in the exemplary embodiment illustrated, to a semiconductor device in accordance with FIG. 1 and the package corresponds to that in FIG. 4, and so reference is made to the explanations thereof with regard to their embodiments. It will be clear to one of skill in the art that other configurations from among the configurations of the semiconductor devices and packages that have been illustrated comprehensively above can also be used, in which case the mechanical connection and contacting are to be adapted according to the known apparatus and methods for stacking packages.

As shown in FIG. 16, land pads 72 corresponding to the ball grid array 51 are arranged on that surface of the package arranged at the bottom in the stack which faces the upper package, the solder balls 50 being soldered to the land pads 72 in order to produce the mechanical and electrical connection. Each land pad 72 is electrically connected to a metallized plated-through hole 74 in the lower package by means of a redistribution layer 44 formed on the cover 19 of the lower package. In a manner comparable to the embodiment of the outer contact pads 46 at the package, the land pads 72 are also surrounded by a protective layer 54 and the redistribution layer 44 is covered by the protective layer 54.

The plated-through holes 74 pass in the region of the frame 22 through cover 19 and substrate 10 of the lower package, i.e., outside the chip bearing area thereof through the lower package, and end in external contacts 48 of the stack. Consequently, by means of the plated-through holes 74, the external contacts 48 of the upper package in the stack are routed downward in order to arrange all the external contacts 48 in the stack in one area. The external contacts 48 of the upper package that are transferred to the lower package in this way are embodied identically to those of the lower package in order to integrate all the external contacts 48 into an external circuit element by means of a uniform bonding process. In the exemplary embodiment illustrated, the ball grid array 51 of the lower package is supplemented by solder balls 50 in the edge region.

Hereby, the cover 19 is provided in the same material as that of the substrate 10, which, if appropriate, is constructed from a plurality of layers, such that the materials are already offered with a metallization from which the routing traces structure is to be fabricated, and so it is thereby possible for the routing traces structure, e.g., in the case of complex ball grid or land grid arrays, to be partly or else completely provided as an inner layer of the lower cover 19.

Figure 17:
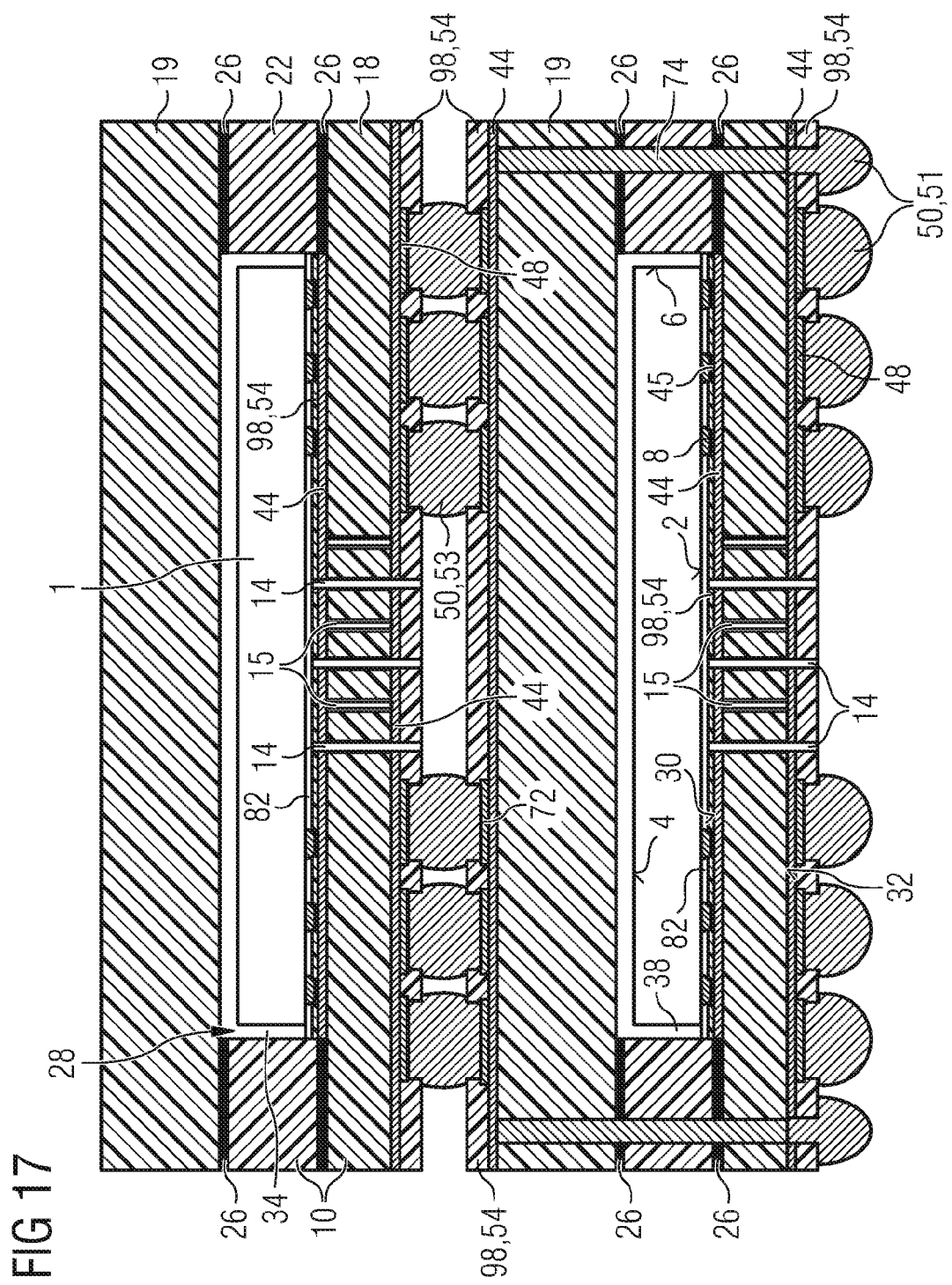
FIG. 17 illustrates a package-on-package stack comprising two semiconductor devices according to FIG. 14B, each comprising one chip.

An alternative stack of packages according to the invention is illustrated in FIG. 17. The individual packages of this stack (stack packages) have, according to FIG. 14B, vias 15 instead of bonding channels 12 in the substrates 10, by means of which, as described above, chip contacts 8 are electrically connected through redistribution layer 44 with external contacts 48 that are in one embodiment provided by solder balls 50 of a Ball Grid Array 51. Redistributing the external contacts 48 of the upper stack package through at least one further redistribution layer 44 on the lower stack package, via through connections 74 through the lower stack package in the frame area thereof and via solder balls 50 within the edge area of the lower stack package, is effected as described above. Vents 14 of each stack package formed apart of vias 15 and/or open vias 15 provide open fluid communication with an air film 82 adjacent active side 2 of the chip. Vents 14 and open vias 15 end within an open interspace between the stacked packages or on the bottom of the stack.

Alternatively, a mechanical and electrical connection of the two stack packages may be produced by means of an anisotropic electrically conductive adhesive that establishes an electrically conductive connection between land pads 72 of the lower stack package and outer contact pads 46 of the upper stack package instead of solder balls 50, and establishes an adhesive bonding between the surface of the cover of the lower stack package and that of the substrate of the upper stack package.

In the described manner, alternative embodiments of packages and more than two packages may be stacked.

In one embodiment of the invention modified packages are stacked, in which the substrate 10 of the upper package simultaneously serves as a cover 19 for the underlying package. Hence, the height of the whole stack may be reduced, while each chip 1 of a stack is individually encapsulated.

Such a stack includes at least two stack components each comprising modified packages having a substrate 1 with a substrate pocket 28 and a chip 1 arranged and fixed therein. Alternatively a stack component may comprise a cover 119 having a cover pocket 128 and a chip 1 arranged therein. For the sake of clarity only a stacking of substrates 10 will be described in the following. Stacking covers 19 may be realized in an analogous manner with consideration of possibly required adjustments in terms of electrical connections and fluid communication.

In the embodiment of FIG. 19 a first chip 1 is arranged face down in substrate pocket 28 of a first substrate 10. Chip contacts 8 are connected electrically and mechanically with corresponding inner contact pads 45 of the first substrate 10 by flip chip technology via solder connections. Joints 38 between side faces 6 of the chip and wall 36 of the substrate pocket is unfilled. An adhesive is applied to the rear side 4 of the chip 1 as a layer, for mechanical bonding with a second substrate 10.

A gap 64 between active side 2 of the chip 1 and the first side 30 of the substrate 10 is completely filled with a resist mask 80, e.g., a solder resist mask for producing solder connections between chip 1 and substrate 10. Via redistribution layers 44 on both sides of substrate 10 and through vias 15 provided in the bottom of substrate pocket 28, the solder connections and thus the chip contacts 8 are electrically connected with outer contact pads 46 of the substrate 10.

A second substrate 10 having a substrate pocket 28 and a second chip 1 mounted therein as described above is disposed upon rear side 4 of chip 1 mounted within first substrate 10. The second substrate 10 has a protuberance 94 on its side 30, the protuberance providing a stack area 96 extending in parallel to second side 32 of second substrate 10. Stack area 96 is of the same size as rear side 4 of the lower chip 1 and corresponds, in terms of its position on substrate 10, to the position of lower chip 1 within first substrate 10. Second substrate 10 along with chip 1 is attached to the stack area 96 on rear side 4 of lower chip 1 by an adhesive layer 58.

Protuberance 94 replaces cover 19 in the encapsulation of lower chip 1, so that lower chip 1 is completely encapsulated by virtue of the dimension of protuberance 94. Protuberance 94 is provided unitarily with substrate 10 of the upper semiconductor device, and consequently the encapsulation of the first chip 1 is entirely made up of a single material.

Substrate pocket 28 that mounts upper chip 1 is covered by a cover 19. Cover 19 concomitantly provides an upper end of the package.

Chip contacts 8 of upper chip 1 that are distributed in planar fashion are like those of lower chip 1 electrically connected to vias 15 by solder connections and a redistribution layer 44 on the first side 30 of the upper substrate 10. Vias 15 of the upper semiconductor device are disposed externally of the chip support area and below frame 22 and are electrically connected to interconnections 53 in the form of solder balls 50 through a further redistribution layer 44 on the second side 32 of the second substrate. Interconnections 53 are disposed within clearance 76 between the first and the second substrates, the clearance 76 being present adjacent protuberance 94 and in the area of frame 22 of the first substrate 10 due to the pedestal-like shape of protuberance 94.

Since in one embodiment of the invention the second substrate 10 and protuberance 94 are provided unitarily, redistribution layer 44 on second side 32 of second substrate 10 only extends in the area of clearance 76, and continuing vias 15 extend below upper frame 22. Alternatively, protuberance 94 may be mounted on second side 32 of the substrate 10, such that a redistribution layer 44 may extend throughout second side 32 of the substrate 10 and between substrate 10 and protuberance 94. In this case, vias 15 within second substrate 10 may be provided anywhere in second substrate 10 or may be arranged in an evenly distributed manner, as an electrical connection to redistribution layer 44 may be provided anywhere.

Interconnections 53 serve for electrical connection of the upper and lower semiconductor devices and are produced on second side 32 of second substrate 10 and first side 30 of the first substrate 10 by means of solder resist masks 98. On the first side 30 of the first substrate 10 they are electrically connected to vias 15 within frame 22 of the first substrate 10 through a further redistribution layer 44. Such vias 15 in turn are electrically connected to outer contact pads 46 on the bottom of the package through redistribution layers 44 on both sides of lower substrate base 18 and the vias 15 thereof. Solder balls 50 are formed on outer contact pads 46 by means of a further solder resist mask 98, such solder balls defining the external contacts 48 of the package.

For fabricating a multichip package according to FIG. 19 substrates 10 are prefabricated including frames 22 and substrate pockets 28 and protuberance 94 as well as redistribution layers 44, outer and inner contact pads 46, 45, solder resist mask 98 and resist mask 80 and vias 15 in the required number and position. First, lower chip 1 is positioned face-down in substrate pocket 28 of the lower substrate 10, with its solder bumps formed on chip contacts 8 and not illustrated in detail positioned upon inner contact pads 45, and is connected with inner contact pads 45 by reflow. After establishing the solder connections of lower chip 1, a resist mask 80 completely fills a gap 64 between active side 2 of upper chip 1 and the first side 30 of the substrate 10 leaving the solder bumps exposed.

On stack area 96 of protuberance 94 of the upper substrate 10 an adhesive layer 58 is formed, the upper substrate 10 being applied upon rear side 4 of the lower chip 1 thereby. Prior to this, solder balls 50 are provided adjacent protuberance 94 on outer contact pads 46 of the upper substrate 10, such solder balls being positioned upon contact pads 92 of the frame of lower substrate 10 when connecting the first and second substrates 10 and acting as interconnections 53 between both substrates 10.

An adhesive tape 58 is applied on the surface of cover 19 facing the chip 1, and upper chip 1 is "pick and place" positioned with its rear side 4 upon cover 19 and is joined therewith. Subsequently, cover 19 along with upper chip 1 and hence chip 1 is attached face-down upon second substrate 10 and within upper substrate pocket 28. The joints 38 remain unfilled. Upon connection of cover 19 and substrate 10, the solder bumps on chip contacts 8 of upper chip 1 are positioned on inner contact pads 45 of the second substrates 10. By a further reflow step solder connections of upper chip 1 and electrical connections between first and second substrates 10 via interconnections 53 are produced. After fabrication of solder connections of upper chip 1 a resist mask 80 leaving the solder bumps exposed completely fills a gap 64 between active side 2 of the upper chip 1 and the first substrate surface 30. Finally, solder balls 50 are formed as external contacts 48 of the package on outer contact pads 46 of lower substrate 10 and hence the package utilizing a further solder resist mask 98.

If the method steps described so far are carried out with a greater number of chips 1 within a wafer assembly and with matrix-like substrates 10 and covers 19, respectively, this is followed by singulating the packages.

Another embodiment of a multichip package is illustrated in FIG. 20. In this embodiment there is an air film 82 adjacent the active side 2 of each chip, hence vents 14 are formed apart from vias 15 in both substrate bases 18 and there is a fluid communication between air film 82 and the surrounding atmosphere through vents 14. Fluid communication for air film 82 within upper substrate pocket 28 is provided through first passages 90 within upper frame 22 extending in parallel to the first side 30 of the second substrate 10 up to and through the outer wall of frame 22. In addition or alternatively to this outlet, further passages 91 may extend from first passages 90 and perpendicular thereto and may end in vias 15 within upper substrate base 18 that in turn are in fluid communication with the surrounding atmosphere.

In another embodiment of the invention, protuberance 94 constitutes a separate component in the form of a plate-like element, bonded to the second side 32 of the second substrate 10 by an adhesive layer 58. Protuberance 94 again is sized and positioned such that upon bonding protuberance 94 onto rear side 4 of the lower chip 1 the lower substrate pocket 28 is sealed and lower chip 1 is completely encapsulated. For the further implementation of the multichip package of FIG. 20, reference is made to the discussion in conjunction with FIGS. 14 and 18, and, in terms of fabrication, reference is made to the discussion concerning FIG. 19, with a further method step that has to be added for adhesive bonding of protuberance 94 and the second substrate 10.

While the multichip packages of FIGS. 19 and 20 comprise only two modified packages each including one chip 1, stacking of more than two of such modified packages is possible. To this aim, additional stack components may be introduced between the cover 19 of the stack and the uppermost stack component, each comprising one chip 1 and being implemented similarly to the uppermost stack component, exhibiting the same functionality, or may alternatively divert from the design thereof. In this case, within one stack the material of the individual substrates 10 and cover 19 is the same. In terms of methods for producing the individual stack components, for mounting chips within a stack component and for connecting the same, further reference is made to the explanations referring to packages comprising one chip 1.

Embodiments of the invention, with regard to the semiconductor devices, the packages and the stack arrangements, also encompasses those configurations in which a pocket 28, 128 is formed partly in the substrate 10 and partly in the cover 119. In this case, the total height of both pockets 28, 128 corresponds at least to the chip height. The modifications and configurations of the substrate pocket 28 and cover pockets 128 as explained above, e.g., with regard to the fixing, the formation of joints 38, 138, gaps 64, 164 and interspaces 42, 142 or the filling, can then also be applied individually, or combined in an expedient manner, to such a semiconductor device and package.

Furthermore, the invention is not intended to be restricted to the arrangement of only one chip 1 within the encapsulation since, through corresponding configuration of the substrate pocket 28 or cover pocket 128 in a comparable manner, it is also possible for more than one chip 1 to be jointly encapsulated. On account of the variability of the configuration of substrate 10, 120 and cover 19, 119, it is also possible for the chips 1 to be arranged in a side-to-side relationship. The required contactations of the individual chips 1 can thus be integrated into the semiconductor device according to the invention.

What is claimed is:

1. A semiconductor device with a chip mounted on a substrate, the semiconductor device comprising:
    a chip having an active side and a rear side and also having lateral faces and having chip contacts on the active side;
    a substrate having a first side and a second side, wherein the chip is arranged over the first side of the substrate and at least partially overlies the first side, the substrate having contacts arranged on the second side, the contacts being electrically connected to the chip contacts;
    a cover connected to the substrate, wherein the cover and the substrate encapsulate the chip on all sides, the chip being fixed in position within a pocket formed by the connected cover and the substrate, wherein the cover and the substrate comprise the same material; and
    at least one joint between one of two mutually opposite lateral faces of the chip and the pocket, and wherein at least one wall of the pocket adjacent the joint has lateral spacers for laterally fixing the chip in position.

2. The semiconductor device as claimed in claim 1, wherein the pocket comprises a substrate pocket, the substrate pocket having a size and shape such that it receives the chip and the cover closes off the substrate pocket.

3. The semiconductor device as claimed in claim 2, wherein the cover comprises a plate-like element connected in planar fashion to a plate-like frame having a passage, the passage forming the substrate pocket.

4. The semiconductor device as claimed in claim 1, wherein the pocket comprises a cover pocket within a surface of the cover, the cover pocket having a size and shape such that it receives the chip and the substrate closes off the cover pocket.

5. The semiconductor device as claimed in claim 4, wherein the substrate comprises a plate-like element connected in planar fashion to a plate-like frame having a passage, the passage forming the cover pocket.

6. The semiconductor device as claimed in claim 1, wherein the pocket is slightly larger than the chip in at least one lateral extent and there is at least one joint between at least one lateral face of the chip and the pocket.

7. The semiconductor device as claimed in claim 6, wherein the pocket has a depth that is slightly larger than a height of the chip so that an interspace is created between the chip and the cover, the interspace being filled with a curable compound.

8. The semiconductor device as claimed in claim 1, wherein the substrate includes chip air vents in a region covered by the chip, the chip air vents each having an opening on the first and the second sides.

9. The semiconductor device as claimed in claim 8, further comprising a layer overlying the second side of the substrate, the chip air vents extending through the layer.

10. The semiconductor device as claimed in claim 1, wherein the substrate has at least one opening that corresponds in terms of position, size and shape to the chip contacts such that all the chip contacts can be contacted through the at least one opening.

11. The semiconductor device as claimed in claim 1, wherein the chip is arranged face down above the substrate, the substrate having vias extending from the first side to the second side such that a respective path is defined through each of the vias up to the respective chip contact.

12. The semiconductor device as claimed in claim 1, wherein the substrate has a metal layer at least on the first side.

13. The semiconductor device as claimed in claim 12, further comprising a redistribution layer within the metal layer.

14. The semiconductor device as claimed in claim 1, wherein the chip comprises a stack of chips.

15. The semiconductor device as claimed in claim 1, wherein the contacts arranged on the second side of the substrate comprise external contacts for making electrical contact with the semiconductor device, the external contacts being electrically connected to the chip contacts.

16. The semiconductor device as claimed in claim 15, wherein:
the chip contacts are arranged centrally in at least one row;
the substrate has at least one bonding channel that corresponds in terms of position, size and shape to an area of the chip contacts;
the chip is disposed face-down on the substrate, such that all the chip contacts can be contacted through the bonding channel and the chip contacts are electrically connected to outer contact pads by bond wires; and
the bonding channel is filled with a curable rigid material.

17. The semiconductor device as claimed in claim 16, wherein the substrate has in the region covered by chip air vents, each chip air vent having a first opening on the first side and a second opening on the second side of the substrate.

18. The semiconductor device as claimed in claim 15, wherein the chip is disposed face-down above the substrate, the substrate having vias extending from the first side to the second side, each via defining an electrical path to the respective chip contact for connecting the chip contact to an outer contact pad.

19. The semiconductor device as claimed in claim 18, wherein a gap between the chip and the substrate is filled with a resist mask having mask openings within an area of the chip contacts.

20. The semiconductor device as claimed in claim 19, wherein the substrate comprises chip air vents extending through the substrate, and wherein an air film is provided in parallel to the active side of the chip, the air film being in communication with the chip air vents.

21. The semiconductor device as claimed in claim 15, wherein the chip comprises a stack of chips mounted on the substrate.

22. A semiconductor device with a chip mounted on a substrate, the semiconductor device comprising:
a chip having an active side and a rear side and also having lateral faces and having chip contacts on the active side;
a substrate having a first side and a second side, wherein the chip is arranged over the first side of the substrate and at least partially overlies the first side, the substrate having contacts arranged on the second side, the contacts being electrically connected to the chip contacts;
a cover connected to the substrate, wherein the cover and the substrate encapsulate the chip on all sides, the chip being fixed in position within a pocket formed by the connected cover and the substrate, wherein the cover and the substrate comprise the same material;
wherein a depth of the pocket is slightly larger than a height of the chip such that there is a gap between the chip and the substrate; and
at least one distance holder on which the chip's outer edges bear at least in sections and which are formed by a plate-like additional frame, which has at least one passage and is connected in planar fashion to the substrate or to a substrate base and is composed of the same material as the substrate.

23. A semiconductor device with a chip mounted on a substrate, the semiconductor device comprising:
a chip having an active side and a rear side and also having lateral faces and having chip contacts on the active side;
a substrate having a first side and a second side, wherein the chip is arranged over the first side of the substrate and at least partially overlies the first side, the substrate having contacts arranged on the second side, the contacts being electrically connected to the chip contacts;
a cover connected to the substrate, wherein the cover and the substrate encapsulate the chip on all sides, the chip being fixed in position within a pocket formed by the connected cover and the substrate, wherein the cover and the substrate comprise the same material;
wherein the substrate has at least one opening that corresponds in terms of position, size and shape to the chip contacts such that all the chip contacts can be contacted through the at least one opening;
distance holders that adjust a gap between the active side of the chip and the substrate; and
at least one further distance element arranged between the chip and the substrate adjacent to a bonding channel.

24. The semiconductor device as claimed in claim 1, wherein the at least one further distance element and/or the distance holders comprise a cured mold compound.

25. A semiconductor device with a chip mounted on a substrate, the semiconductor device comprising:
a chip having an active side and a rear side and also having lateral faces and having chip contacts on the active side;
a substrate having a first side and a second side, wherein the chip is arranged over the first side of the substrate and at least partially overlies the first side, the substrate having contacts arranged on the second side, the contacts being electrically connected to the chip contacts;
a cover connected to the substrate, wherein the cover and the substrate encapsulate the chip on all sides, the chip being fixed in position within a pocket formed by the connected cover and the substrate, wherein the cover and the substrate comprise the same material;
wherein the chip is arranged face down above the substrate, the substrate having vias extending from the first side to the second side such that a respective path is defined through each of the vias up to the respective chip contact; and
wherein a depth of the pocket is slightly larger than a height of the chip, a gap between the chip and the substrate being filled with a resist mask having mask openings in an area of the chip contacts and in an area of the vias.

26. The semiconductor device as claimed in claim 25, wherein:
the substrate comprises chip air vents extending through the substrate, and an air film is formed between the resist mask and the chip, the air film being in fluid communication with a surrounding environment through the chip air vents.

27. A semiconductor component comprising:
a plurality of semiconductor devices, each semiconductor device comprising:
  a chip having an active side and a rear side and also having lateral faces and having chip contacts on the active side; a substrate
  having a first side and a second side, wherein the chip is arranged over the first side of the substrate and at least partially overlies the first side, the substrate having contacts arranged on the second side, the contacts being electrically connected to the chip contacts, wherein the contacts arranged on the second side of the substrate comprise external contacts for making electrical contact with the semiconductor device, the external contacts being electrically connected to the chip contacts;
  and a cover connected to the substrate, wherein the cover and the substrate encapsulate the chip on all sides, the chip being fixed in position within a pocket formed by the connected cover and the substrate,
wherein
the substrate and the cover of each semiconductor device of the plurality of semiconductor devices comprise the same material,
the semiconductor devices are stacked one above another, and
the external contacts of at least one semiconductor device are electrically connected to external contacts of the semiconductor component by means of interconnections and vias; and at least one distance holder on which the chip's outer edges bear at least in sections and which are formed by a plate-like additional frame, which has at least one passage and is connected in planar fashion to the substrate or to a substrate base and is composed of the same material as the substrate; distance holders that adjust a gap between the active side of the chip and the substrate; and at least one further distance element arranged between the chip and the substrate adjacent to a bonding channel; a gap between the chip and the substrate being filled with a resist mask having mask openings in an area of the chip contacts and in an area of the vias; wherein: the substrate comprises chip air vents extending through the substrate, a depth of the pocket is slightly larger than a height of the chip and there is a gap between the chip and the substrate, a resist mask is arranged within the gap and covering the substrate, the resist mask having mask openings in an area of the chip contacts and in an area of the vias, and an air film is formed between the resist mask and the chip, the air film being in fluid communication with a surrounding environment through the chip air vents.

28. The semiconductor component as claimed in claim 27, wherein:
the vias are arranged outside an area of a semiconductor device that is overlaid by the chip;
the interconnections electrically connect the external contacts of the semiconductor device to the vias; and
the external contacts of the semiconductor component are electrically connected to bottom portions of the vias.

29. The semiconductor component as claimed in claim 28, further comprising at least one spacer arranged between a pair of semiconductor devices and adjacent to the interconnections, the spacer being composed of the same material as the cover and the substrate of each of the semiconductor devices.

30. The semiconductor component as claimed in claim 27, wherein the semiconductor devices are stacked one above the other while maintaining a gap such that air vents within the substrate of at least one of the semiconductor devices end in the gap;
wherein the external contacts of the at least one semiconductor device are electrically connected with external contacts of the semiconductor component via interconnections and metallized vias;
wherein the metallized vias are arranged externally to a chip support area for the chip of the semiconductor device;
wherein the interconnections electrically connect the external contacts of the semiconductor device with the metallized vias; and
wherein the external contacts of the semiconductor component are electrically connected with bottom openings of the metallized vias.

31. A component for mounting chips in a semiconductor device or a semiconductor package, the component comprising:
a frame;
a base connected to the frame; and
a pocket for a chip to be accommodated, the pocket formed from a first opening in the frame which ends on the base, the pocket having a height, a size and a shape that are at least as great as a height, a size and a shape of the chip to be accommodated;
wherein the pocket has an outline that is slightly larger than a footprint of the chip to be accommodated and wherein at least two of opposing walls of the pocket have projections that project into the pocket to fix the chip to be accommodated in position.

32. A component for mounting chips in a semiconductor device or a semiconductor package, the component comprising:
a frame;
a base connected to the frame;
a pocket for a chip to be accommodated, the pocket formed from a first opening in the frame which ends on the base, the pocket having a height, a size and a shape that are at least as great as a height, a size and a shape of the chip to be accommodated; and
a redistribution layer at least on a surface that is opposite to a surface from which the pocket extends.

33. The component as claimed in claim 32, further comprising electrically conductive contact pads at least on the surface with the redistribution layer.

34. The component as claimed in claim 32, wherein the surface with the redistribution layer is patterned in order to enlarge its surface area.

35. A component for mounting chips in a semiconductor device or a semiconductor package, the component comprising:
a frame;
a base connected to the frame;
a pocket for a chip to accommodated, the pocket formed from a first opening in the frame which ends on the base, the pocket having a height, a size and a shape that are at least as great as a height, a size and a shape of the chip to be accommodated; and
wherein:
the base comprises a redistribution layer on both of its sides, the redistribution layer including electrically conductive contact pads and vias; and at least a pair of the contact pads arranged on opposite sides of the base, the pair of contact pads being electrically interconnected by the redistribution layer and the vias.

36. The component as claimed in claim 35, wherein:
the frame comprises a redistribution layer at least on a surface facing away from the base, the redistribution layer including electrically conductive contact pads and vias; and
at least one contact pad of the frame is electrically connected with a contact pad on the side of the base facing away from the frame by means of the redistribution layer and the vias.

37. The component as claimed in claim 36, wherein the base comprises a pedestal-shaped spacer on the side of the base facing away from the frame, the spacer having an outline that is the same as or larger than an outline of the pocket and smaller than an outline of the base such that the contact pads of the base are exposed.

38. A component for mounting chips in a semiconductor device or a semiconductor package, the component comprising:
a frame;
a base connected to the frame;
a pocket for a chip to be accommodated, the pocket formed from a first opening in the frame which ends on the base, the pocket having a height, a size and a shape that are at least as great as a height, a size and a shape of the chip to be accommodated; and
wherein a plurality of pockets are arranged in a matrix such that pockets of a row or of a column of the matrix are connected to one another and to a respective cavity at each end of the row or column by channel-like connections.

39. A semiconductor package including at least two chips, the semiconductor package comprising:
a first chip having an active side and a rear side and side faces, the first chip including chip contacts on the active side;
a second chip having an active side and a rear side and side faces, the second chip including chip contacts on the active side;
a first component a first frame, a first base connected to the first frame, and a first pocket formed from a first opening in the first frame which ends on the first base, the first chip being fixed in position in the first pocket of the first component, the active side of the first chip facing the first base of the first component, and the chip contacts of the first chip being electrically connected with first contact pads of the first base of the first component;
a second component comprising a second frame, a second base connected to the second frame, and a second pocket formed from a first opening in the second frame which ends on the second base, the second chip being fixed in position in the second pocket of the second component, the active side of the second chip facing the second base of the second component, the chip contacts of the second chip being electrically connected with second contact pads of the second base of the second component, wherein the second component is stacked above the first component in such a way that the first base of the first component is joined to the second frame of the second component; and a cover joined to the first frame of the first component and closing off the first pocket of the first component.

40. The semiconductor package as claimed in claim 39, further comprising a spacer between the first component and the second component, the spacer covering at least a rear side of an underlying chip to leave exposed areas on which interconnections are arranged.

41. The semiconductor package as claimed in claim 39, wherein a gap is provided in at least one of the first and second components between the chip of that component and the base of that component, the gap being filled with a resist mask having mask openings within an area of the chip contacts.

42. The semiconductor package as claimed in claim 39, wherein:
a gap is provided in at least one of the first and second components between the chip of that component and the base of that component;
a resist mask is disposed within the gap and covering the base, the resist mask having mask openings at least within an area of the chip contacts; and
an air film is formed between the resist mask and the chip, the air film being in communication with a surrounding atmosphere through air vents provided in the at least one component.

* * * * *